(12) United States Patent
Uzawa et al.

(10) Patent No.: US 7,067,839 B2
(45) Date of Patent: Jun. 27, 2006

(54) TUNING CIRCUIT WITH DISTRIBUTED TUNNEL JUNCTION ELEMENTS AND SUPERCONDUCTOR INTEGRATED CIRCUIT COMPRISING THE TUNING CIRCUIT

(75) Inventors: Yoshinori Uzawa, Tokyo (JP); Zhen Wang, Tokyo (JP)

(73) Assignee: National Institute of Information and Communication Technology, Tokyo (JP)

( * ) Notice: Subject to any disclaimer, the term of this patent is extended or adjusted under 35 U.S.C. 154(b) by 492 days.

(21) Appl. No.: 10/348,987

(22) Filed: Jan. 23, 2003

(65) Prior Publication Data

US 2003/0144152 A1   Jul. 31, 2003

(30) Foreign Application Priority Data

Jan. 25, 2002   (JP)  .............................. 2002-017223

(51) Int. Cl.
*H01L 29/06*   (2006.01)
(52) U.S. Cl. ........................................ 257/31; 257/661
(58) Field of Classification Search ................ 257/31, 257/758, 661–663
See application file for complete search history.

(56) References Cited

U.S. PATENT DOCUMENTS 4,344,052 A * 8/1982 Davidson .................... 333/222
4,498,228 A * 2/1985 Jillie et al. ..................... 438/2
2003/0144152 A1* 7/2003 Uzawa et al. ............... 505/400

OTHER PUBLICATIONS

Conference of the Japan Society of Applied Physics, No. 49, Abstracts, p. 275, by Uzawa et al., Mar. 2002.*
S.C. Shi et al., "Low-Noise Superconducting Receivers for Millimeter and Submillimeter Wavelengths," IEICE Trans. Electron. E81-C (1998), pp. 1584-1594, Oct. 1998.
Masanori Takeda et al., "Predicted Performance of Superconductor-Insulator-Superconductor Mixers with Inhomogeneous Distributed Junction Arrays," Jpn. J. Appl. Phys. 39 (2000) pp. 5095-5098, Sep. 2000.
Cheuk-yu E. Tong et al., "Quantum Limited Heterodyne Detection in Superconducting Non-linear Transmission Lines at Sub-millimeter Wavelengths," Appl. Phys. Lett. 67 (1995) pp. 1304-1306, Aug. 1995.
Cheuk-yu E. Tong et al., "Distributed Quasiparticle Mixing in a Non-linear Transmission Line at Sub-millimeter Wavelengths," IEEE Trans. Appl. Supercond. vol. 7, No. 2, Jun. 1997, pp. 3597-3600.

(Continued)

*Primary Examiner*—Mark V. Prenty

(57) ABSTRACT

It is an object to provide a tuning circuit which has large fractional frequency band width, for example frequency band of the return loss of less than −10 dB. The tuning circuit is composed of a superconductor microstrip lines, a superconductor distributed tunnel junction elements, a signal input part and a signal output part. It comprises at least a superconductor microstrip line and at least two superconductor tunnel junction elements, wherein the microstrip line and the tunnel junction element are connected alternately. The microstrip line and the tunnel junction element are half-wavelength of an input signal at a center frequency. A quarter-wavelength impedance transformer is comprised between a signal input part and a half-wavelength tunnel junction which is nearest to the signal input part.

6 Claims, 16 Drawing Sheets

OTHER PUBLICATIONS

V. Yu. Belitsky et al., "Superconductor-insulator-superconductor Tunnel Strip Line: Features and Applications," Appl. Phys. 80. Oct. 15, 1996, pp. 4741-4748.

Yoshinori Uzawa et al., "Performance of All-NbN Quasi-Optical SIS Mixers for the Terahertz Band," IEEE Trans. Appl. Supercond. vol. 11, No. 1, Mar. 2001, pp. 183-186.

Teruhiko Matsunaga et al., "A 600-700 GHz Resonant Distributed Junction for a Fixed-Tuned Waveguide Receiver," IEICE Trans. Electron. vol. E85-C Mar. 2002, pp. 738-741.

Yoshinori Uzawa et al., "Performance of an all-NBN Quasi-Optical SIS Mixer for the Terahertz Band," Proc. 12th Int. Symp. Space Terahertz Technology, San Diego CA, Mar. 2001, pp. 352-362.

John R. Tucker et al., "Quantum Detection At Millimeter Wavelengths," Mod. Phys., vol. 57, No. 4, Oct. 1985, pp. 1055-1113.

Robert E. Collin, "Foundations for Microwave Engineering," (McGraw-Hill, New York, 1992) 2nd ed., Chap. 5, pp. 360-365.

Y. Uzawa et al., "Studies of High Temperature Superconductors," ed. A.V. Narliker (Nova Science, Hauppauge, NY, 2002) vol. 43, chap. 9, p. 268-277.

Gregory S. Lee et al., "Geometric and Material Dispersion in Josephson Transmission Lines" IEEE Trans. Appl. Supercond. 2 (1992) pp. 67-73, Jun. 1992.

D.C. Mattis et al., "Theory of the Anomalous Skin Effect in Normal and Superconducting Metals," Phys. Rev., vol. 111, No. 2, Jul. 15, 1958, pp. 412-417.

Cheuk-yu E. Tong et al., "Theory of Distributed Mixing and Amplification in a Superconducting Quasi-Particle Nonlinear Transmission Line" IEEE Trans. Microwave Theory Tech., vol. 45, No. 7, Jul. 1997, pp. 1086-1092.

S.C. Shi et al., "Analytical Prediction for the Optimum Operating Conditions of SIS Mixers," International Journal Infrared Millimeter Wave, vol. 14, No. 6, (1993), pp. 1273-1292, Mar. 1993.

Yoshinori Uzawa et al., Design and Analysis of a Waveguide NbN-based SIS Mixer using a Tuning Circuit with Two Half-Wavelength Distributed Junctions for the 900-GHz Band, Thirteenth International Symposium on Space Terahertz Technology, Harvard University, Mar. 2002, pp. 435-440.

Yoshinori Uzawa et al., A Circuit for Tuning Superconductor-Insulator-Superconductor Mixers Using Distributed Tunnel Junctions, Jpn. J. Appl. Phys. vol. 42 (2003) pp. 91-95, Jan. 2003.

\* cited by examiner

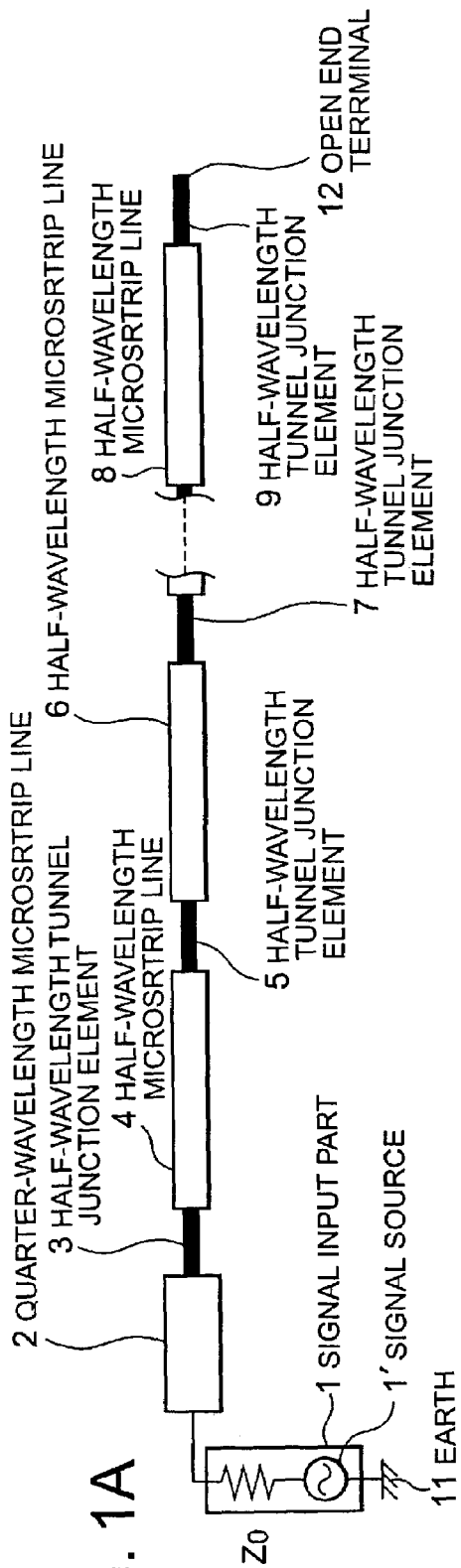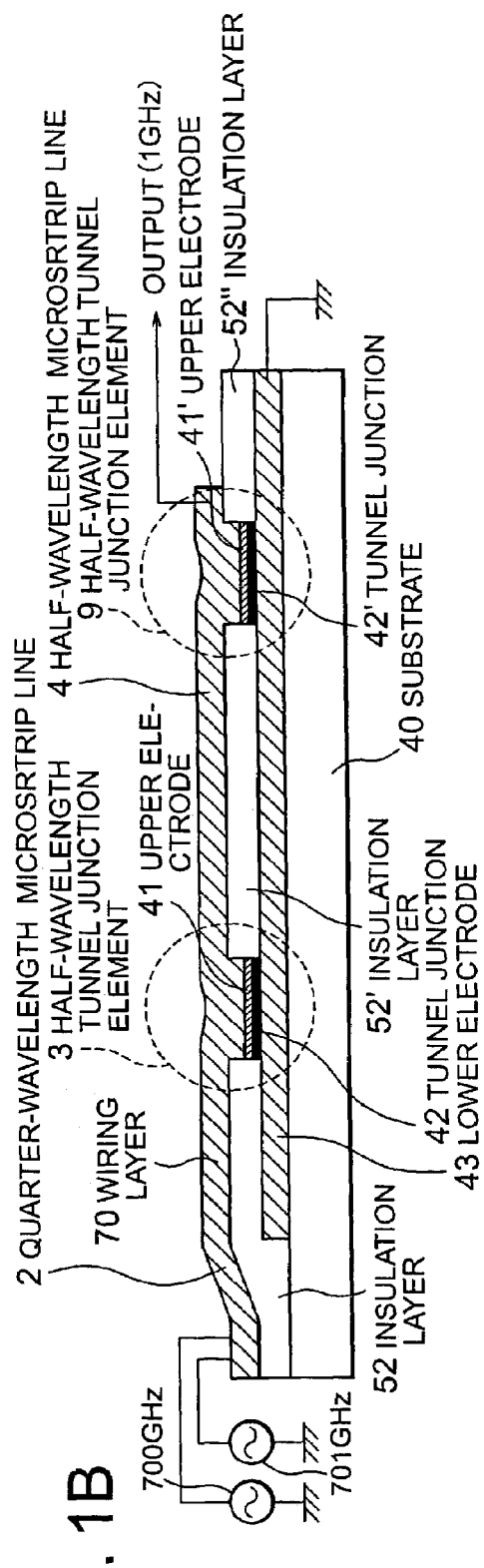

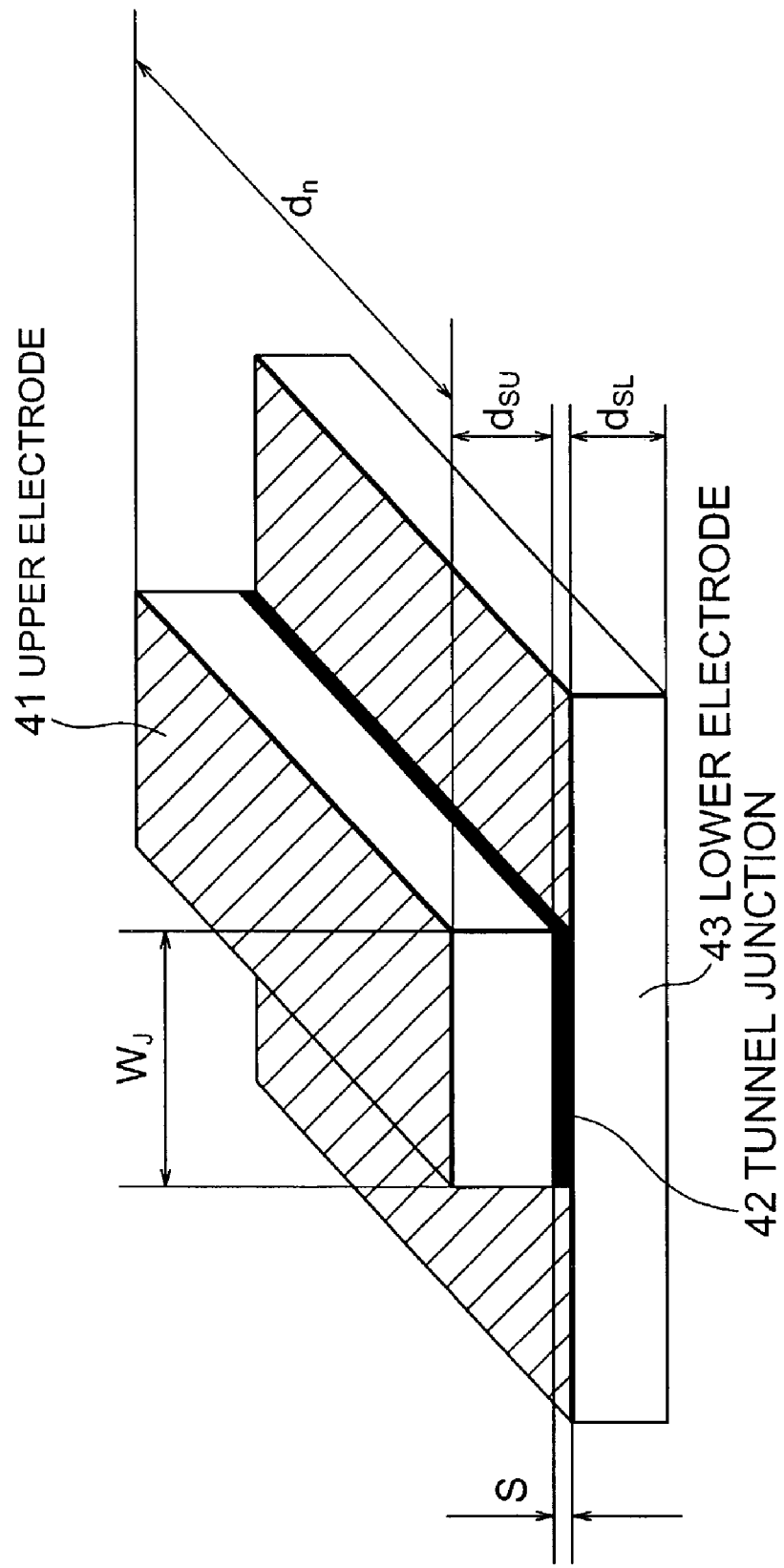

TUNING CIRCUIT WITH DISTRIBUTED TUNNEL JUNCTION ELEMENTS AND SUPERCONDUCTOR INTEGRATED CIRCUIT COMPRISING THE TUNING CIRCUIT

CROSS-REFERENCE TO RELATED APPLICATION

This application claims priority from Japanese Patent Application No. 2002-017223, filed Jan. 25, 2002 in Japan, the contents of which are incorporated herein by reference.

BACKGROUND OF THE INVENTION

1. Field of the Invention

The present invention relates to a tuning circuit with tunnel junction elements and a superconductor integrated circuit comprising the tuning circuit. Broad band tuning circuit in submillimeter wave region is needed in a radio telescope etc. The present invention provides a tuning circuit with tunnel junctions comprising frequency characteristics of small return loss in broad band.

2. Description of the Related Art

As prior art, it is known that is a tuning circuit composed of a signal source, a microstrip line of quarter-wavelength for impedance matching and a Superconductor-Insulator-Superconductor (SIS) junction element of half-wavelength or full wavelength as mixer.

FIG. 14 shows an example of prior art tuning circuit with SIS junction element. As shown in FIG. 14, the tuning circuit is composed of a signal source 1', a quarter-wavelength strip line 2 and a full-wavelength SIS junction element 10. The full-wavelength SIS junction element 10 has a tunnel junction and superconductor electrodes, and connected to the quarter-wavelength microstrip line 2. The end terminal of the full-wavelength SIS junction element 10 is open circuit. The inner impedance of the signal source is $Z_0$, and connected to the quarter-wavelength microstrip line and the earth.

FIGS. 15A and 15B show an example of a structure of the prior art tuning circuit. FIG. 15A shows a plain view and FIG. 15B shows a cross sectional view. The tuning circuit shown in FIGS. 15A and 15B is fabricated by following process. Trilayers of Nb/AlO$_x$/Nb are layered on a substrate 40. The upper Nb and the AlO$_x$ layers are etched to form the upper electrode 41 and the tunnel junction 42 as shown in FIG. 15B using photo-resist mask and photolithography technique. The lower Nb layer is the lower electrode 43. An insulation layer 73 is layered over the substrate 40, the lower electrode 43 and a photo-resist mask (not shown) remained on the upper electrode 41. Further the photo-resist is lift off to form the contact hole contacting a wiring layer 70 to the upper electrode 41. The wiring layer 70 of Nb is deposited on the insulation layer 52,73 so as to contact the upper electrode 41. The lower electrode 43, the tunnel junction 42 and the upper electrode 41 compose a SIS tunnel junction element. The lower electrode 43 acts further as antenna 72. The wiring layer 70 acts as an electric line contacted to the upper electrode 41 of the SIS tunnel junction element, a upper strip line of the quarter-wavelength microstrip line 2 and an antenna 71.

In FIGS. 15A and 15B, the full-wave length SIS junction element 10 is composed of the lower electrode 41, the tunnel junction 42 and the upper electrode 43. The length of the full-wavelength SIS junction element 10 is a full-wavelength of the input signal at a center frequency, and the length of the quarter-wavelength microstrip line 2 is a quarter of a full-wavelength of the input signal. The width of full-wavelength junction element 10 is 0.6 μm, and the length is 8.68 μm. The width of the microstrip line is 3.5 μm and the length is 44.2 μm which is equal to a quarter of the input signal wavelength.

FIGS. 16A and 16B show characteristics of the tuning circuit of FIGS. 15A and 15B. FIG. 16A is Smith chart which shows an impedance locus obtained by changing input signal frequency. FIG. 16B shows characteristics of frequency to return loss for input signal power. The return loss of −10 dB in FIG. 16B corresponds to a circle of reflection coefficient of 0.3 on the Smith chart of FIG. 16A. The inner impedance $Z_0$ of the signal source is 40Ω.

A tuning circuit of the reflection coefficient of less than −10 dB is needed usually. As shown from FIG. 16B, the frequency band of return loss of less than −10 dB of the prior art tuning circuit is about 650 GHz–675 GHz.

The frequency band of tuning circuit of the prior art shown in FIG. 14 is decided with Q factor of the SIS junction element. The frequency band is narrow, when the Q factor of the element is high. When higher the Q, the frequency band is narrower. The Q factor of SIS junction element follows from junction current density. When the junction current density is high, the Q factor is small, and contrarily when the junction current density is small, the Q factor is large. Thus, if the junction current density is controlled so as to be high, the broad band for the return loss of less than −10 dB is realized. Usually the high current density of the junction cannot be realized easily using junction fabrication technologies of the prior art. Thus it is very difficult to realize the tuning circuit of the broad band, using the prior art.

SUMMARY OF THE INVENTION

An object of the present invention is to provide a tuning circuit which has a large fractional frequency band width, for example a frequency band of the return loss of less than −10 dB.

The tuning circuit of the present invention is composed of a superconductor microstrip line, a superconductor distributed tunnel junction element, a signal input part and a signal output part. It comprises at least a superconductor microstrip line and at least two superconductor tunnel junction elements, wherein the microstrip line and the tunnel junction element are connected alternately.

A superconductor integrated circuit of the present invention is composed of a superconductor microstrip line, a superconductor distributed tunnel junction element, signal input part and signal output part comprising. It is composed of at least one superconductor microstrip line and at least two superconductor tunnel junction elements that the microstrip line and the tunnel junction element are connected alternately. The microstrip line is composed of an upper strip line to act as the strip line, a lower electrode facing to the upper strip line and an insulation layer arranged between the upper line and the lower electrode. The distributed tunnel junction element composed of an upper electrode, a lower electrode and a distributed tunnel junction between the upper electrode and the lower electrode. The lower electrode of the microstrip line is common to the lower electrode of the tunnel junction element. The insulation layer of the microstrip line comprises a contact hole, and the tunnel junction and the upper electrode of the distributed junction element is arranged in the contact hole of the insulation layer. The upper strip line is connected to the upper electrode of the tunnel junction element through the contact hole.

Further the microstrip line and the tunnel junction element are a half-wavelength of an input signal at a center frequency. A quarter-wavelength impedance transformer is comprised between a signal input part and a tunnel junction element which is nearest to the signal input part.

The tuning circuit comprising the above mentioned construction of the present invention produce excellent effects as follow. The characteristic impedance as the band-pass-filter consisted of the half-wavelength components is changed at each section to adjust the band pass characteristics, and further each SIS junction element consumes each power to make broad the band of the band-pass-filter. Thus the impedance loci of Smith chart can be controlled through broad band, that is, desired trajectories around the center of Smith chart of small return loss can be designed.

The objects, advantages and features of the present invention will be more clearly understood by referencing the following detailed disclosure and the accompanying drawings.

BRIEF DESCRIPTION OF THE DRAWINGS

FIG. 1A shows diagram of embodiment 1 of the present invention.

FIG. 1B shows a cross sectional view of the embodiment 1 of the present invention.

FIG. 2 shows a perspective view of an embodiment of SIS junction element of the present invention.

DETAILED DESCRIPTION OF THE PREFERRED EMBODIMENTS

FIG. 1A shows the first embodiment of the present invention, which is composed of m half-wavelength distributed tunnel junction elements, (m−1) half-wavelength microstrip lines and one quarter-wavelength microstrip line. The quarter-wavelength microstrip line is inserted for impedance matching or between the signal input part 1 and the half-wavelength tunnel junction element 3. FIG. 1B shows a cross sectional view of a superconductor integrate circuit to comprise the tuning circuit. The superconductor integrated circuit shows a case of FIG. 1A as m=2.

Figure 15A:
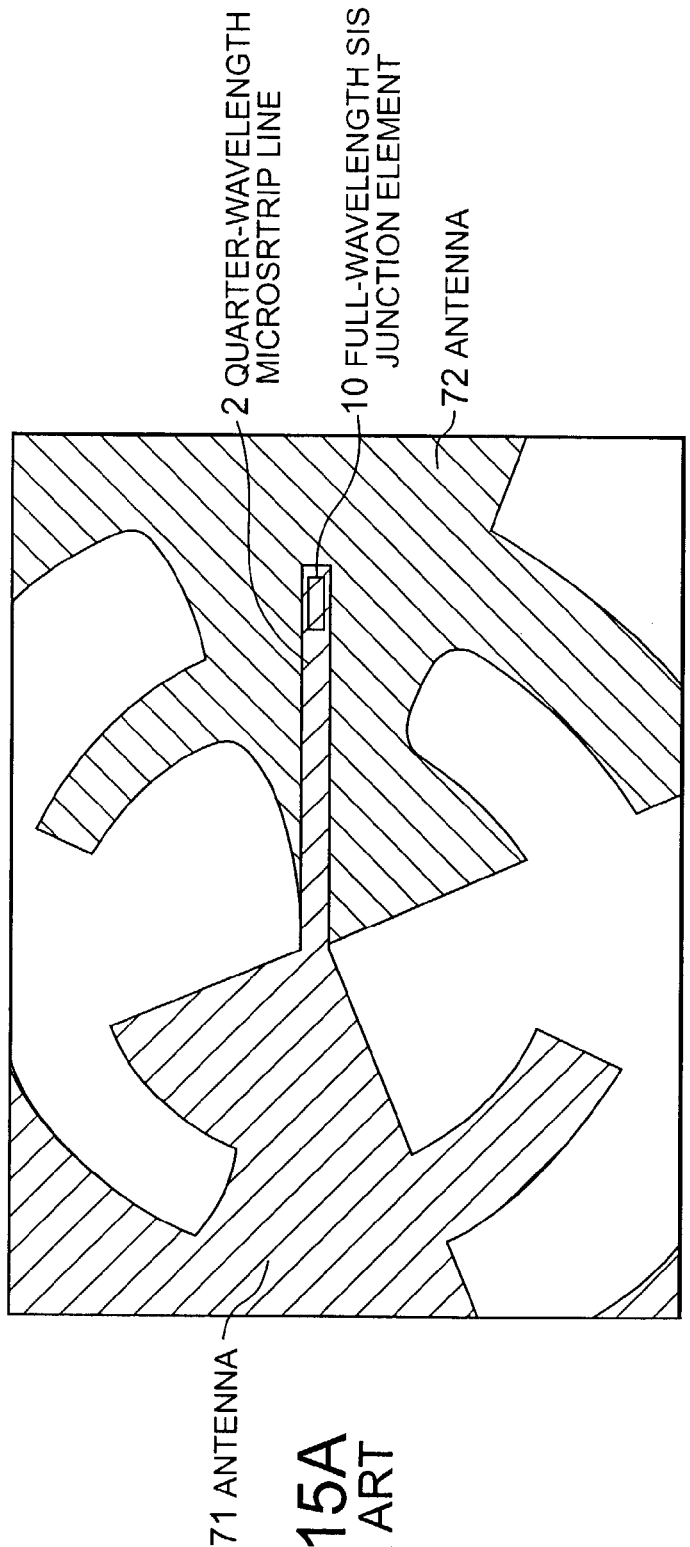
FIG. 15A shows a plane view of a structure of prior art tuning circuit with tunnel junction element.
Figure 15B:
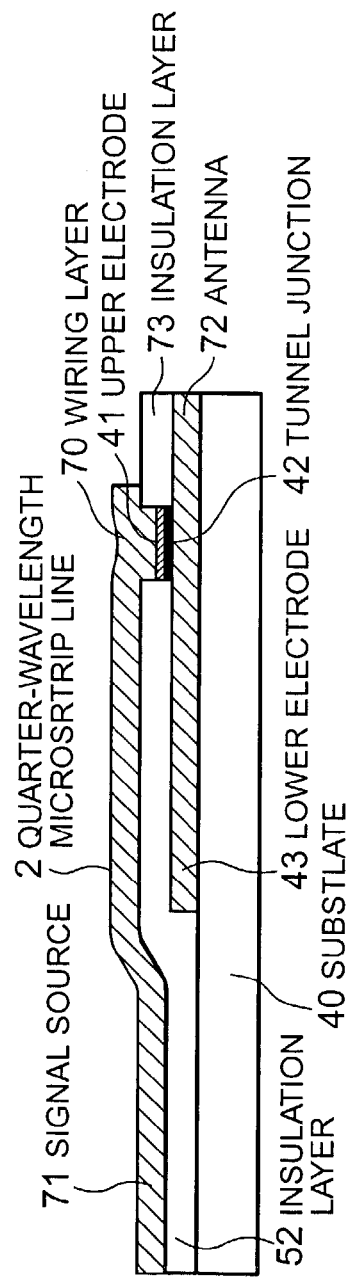
FIG. 15B shows a cross-sectional view of a structure of prior art tuning circuit with tunnel junction element.
Figure 16B:
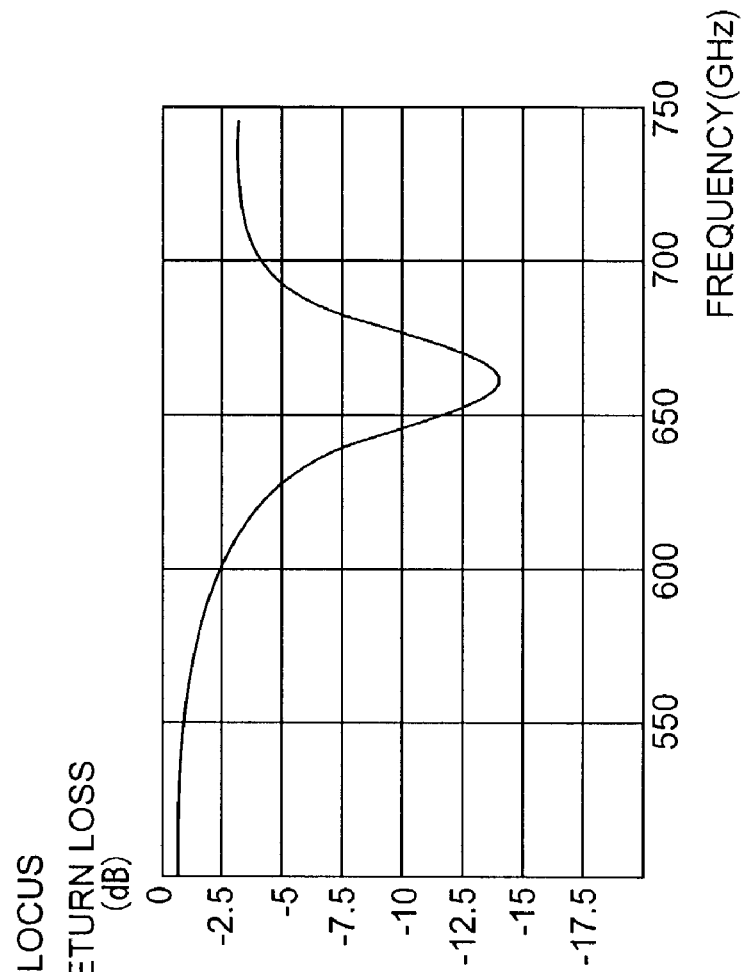
FIG. 16B shows characteristics of the return loss of prior art tuning circuit tunnel junction element
Figure 16A:
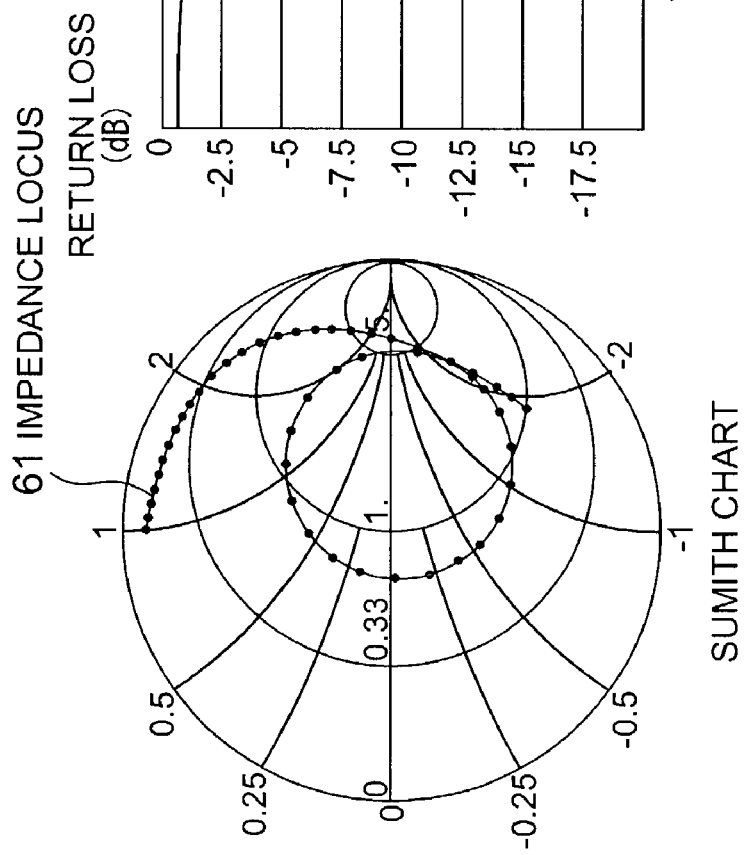
FIG. 16A shows a trajectory on Smith chart of prior art tuning circuit with tunnel junction element.

As shown in FIG. 1A, the first embodiment is composed of a signal input part 1 to input signals, a quarter-wavelength microstrip line 2, half-wavelength distributed tunnel junction elements 3,5,7 and 9, and half-wavelength microstrip lines 4,6 and 8. The signal input part 1 corresponds to the antenna 71 and antenna 72 shown in FIG. 15B. As the inner impedance of the signal source 1' and the input impedance of the half-wavelength distributed tunnel junction element 3 is different with each other, the quarter-wavelength microstrip line 2 is inserted for impedance matching between the signal input part 1 and the half-wavelength tunnel junction element 3. The half-wavelength microstrip lines 4,6,8 and half-wavelength tunnel junction elements 3,5,7,9 are connected each alternately as shown in FIG. 1A. An end terminal 12 of the tunnel junction element 9 is open circuit. The phase velocity of signals through the half-wavelength microstrip lines is different from that of signals through the half-wavelength distributed tunnel junction elements, so the length of the microstrip lines and that of the distributed tunnel junction elements are different each other.

In FIG. 1B, the superconductor integrated circuit of the tuning circuit is composed of a quarter-wavelength microstrip line 2 and half-wavelength distributed tunnel junction elements 3,9 and a half-wavelength microstrip line 4. The half-wavelength distributed tunnel junction elements 3 is composed of an upper electrode 41, a tunnel junction 42 and a lower electrode 43. The half-wavelength distributed tunnel junction elements 9 is composed of an upper electrode 41', a tunnel junction 42' and a lower electrode 43' similarly to the tunnel junction elements 3. The structure shown in FIGS. 1A and 1B is fabricated by following process. Trilayers of Nb/AlO$_x$/Nb are layered on the substrate 40 of SiO$_2$. As the trilayers Nb/AlN/Nb, NbN/AlN/NbN or NbN/MgO/NbN may be used. The trilayers of Nb/AlO$_x$/Nb is explained in the following as an example. The AlO$_x$ and upper Nb are etched to form the tunnel junction 42,42' and the upper electrode 41,41' as shown in FIG. 1B using photo-resist mask (not shown) and photolithography technique. An insulation layer 52 is layered over the substrate 40, the lower electrode 43 and the photo-resist mask remained on the upper electrode 41,41'. Further the photo-resist mask is lift off to form the contact hole to contact the wiring layer 70 to the upper electrode 41, 41'. The wiring layer 70 is deposited on the insulation layer 52,52' and 53' to contact the upper electrodes 41, 41'. The lower electrode 43, the tunnel junction 42 and the upper electrode 41 compose the SIS junction element 3. Similarly the lower electrode 43, the tunnel junction 42' and the upper electrode 41' compose the SIS junction element 9. The wiring layer 70 acts as a upper strip line of the half-wavelength microstrip line 3 and 4. The distributed tunnel junction elements 3 and 9 comprise Superconductor-Insulator-Superconductor junction elements (SIS junction elements).

When using the tuning circuit shown in FIGS. 1A and 1B as a mixer circuit, for example submillimeter wave signal of 700 GHz as a local frequency and of 701 GHz as signal irradiated to the signal input part. The mixing signal of 1 GHZ can be output from the terminal 12.

FIG. 2 shows diagram of an embodiment of SIS junction element. The SIS junction element is composed of an upper electrode 41, a tunnel junction 42 and a lower electrode 43 which is used as an earth electrode. The upper electrode 41 and the lower electrode 43 are composed of superconductor, for example Nb. The tunnel junction 42 is composed of insulator, for example $AlO_x$. The upper electrode 41 has the length of $d_n$, the width of $W_J$ and the thickness of $d_{SU}$. The thickness of the tunnel junction 42 is S, and the thickness of the lower electrode is $d_{SL}$.

Figure 3:
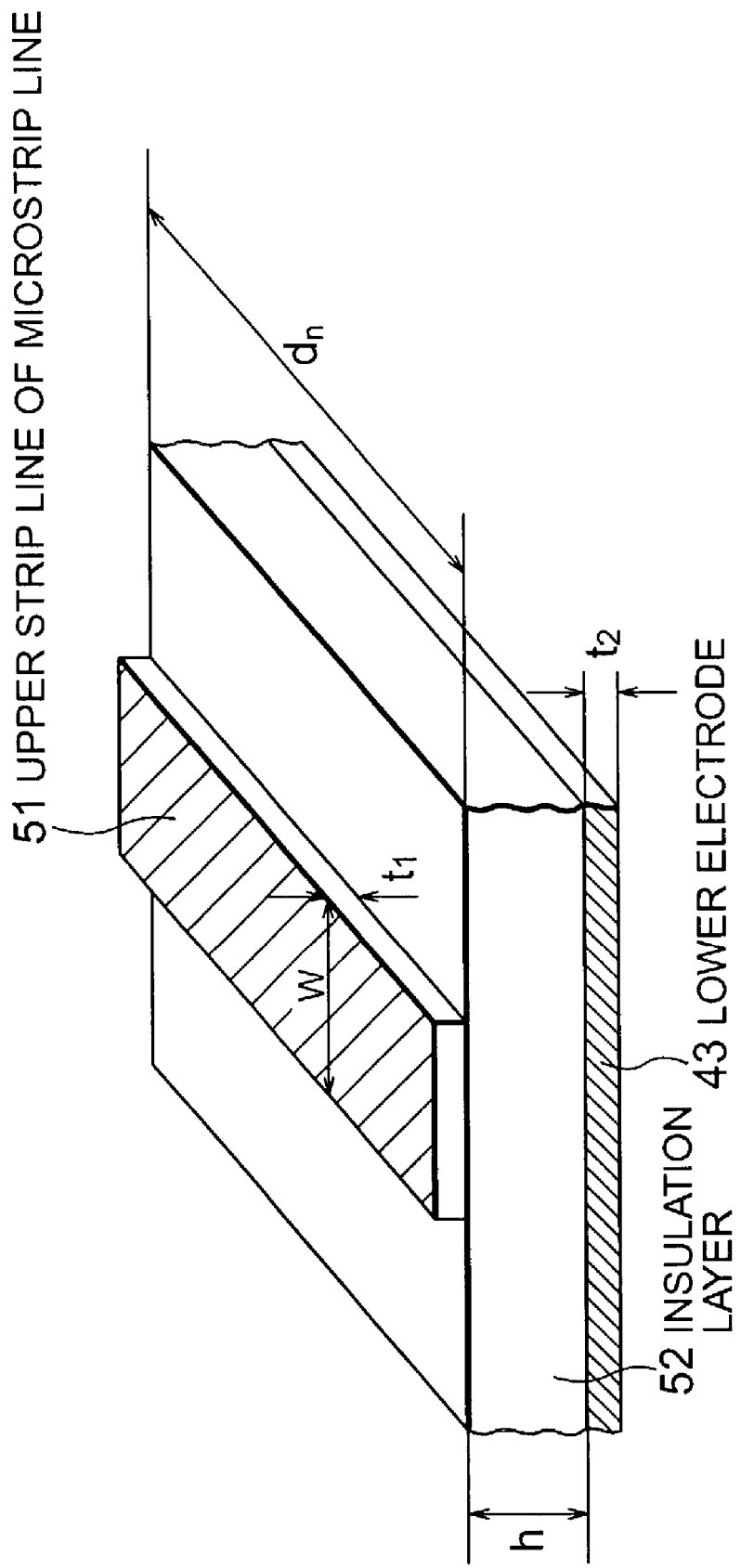
FIG. 3 shows a perspective view of an embodiment of microstrip line of the present invention.

FIG. 3 shows diagram of an embodiment of the microstrip line of the present invention. The structure shown in FIG. 3 is common to the quarter-wavelength microstrip line and the half-wavelength microstrip line. The microstrip line is composed of a upper strip line 51 of superconductor to act as a microstrip line, for example Nb, an insulation layer 52, for example SiO, and a lower electrode 53 of superconductor, for example Nb. The microstrip line has a length of $d_n$, the width of W and the thickness of $t_1$. The thickness of the insulation layer 52 is h, and the thickness of lower electrode 43 is $t_2$. The lower electrode 43 is used as an earth electrode.

In the following, action of the tuning circuit shown in FIG. 1 of the present invention will be explained. SIS junction element is used as the distributed tunnel junction element. Let $Z_n$, $\gamma_n$ and $d_n$ be the characteristic impedance, the propagation constant and its length of the nth element from the terminal 12. When n is odd, the element is the SIS junction element, and n is even, the element is the microstrip line. The input impedance of the first element which is the SIS element 9 at the terminal 12 is as follows.

$$Z_{in}^{(1)} = Z_1 \cot h(\gamma_1 d_1) \tag{1}$$

The input impedance of the microstrip line connected to the distributed SIS junction element 9 at the terminal 12 is as follows.

$$Z_{in}^{(2)} = Z_2 \frac{Z_{in}^{(1)} + Z_2 \tanh(\gamma_2 d_2)}{Z_2 + Z_{in}^{(1)} \tanh(\gamma_2 d_2)} \tag{2}$$

The impedance of the nth element from the terminal 12 is as follows.

$$Z_{in}^{(n)} = Z_n \frac{Z_{in}^{(n-1)} + Z_n \tanh(\gamma_n d_n)}{Z_n + Z_{in}^{(n-1)} \tanh(\gamma_n d_n)} \tag{3}$$

When Nth (N: even) element from the terminal 12 is the quarter-wavelength microstrip line, the input impedance of the Nth element is as follows.

$$Z_{in}^{(N)} = Z_N \frac{Z_{in}^{(N-1)} + Z_N \tanh(\gamma_N d_N)}{Z_N + Z_{in}^{(N-1)} \tanh(\gamma_N d_N)} \tag{4}$$

When the inner impedance of the signal source 1' to input signals to the signal input part 1 is $Z_0$, the reflection coefficient at the Nth element is as follows.

$$\Gamma = \frac{Z_{in}^{(N)} - Z_0}{Z_{in}^{(N)} + Z_0} \tag{5}$$

The characteristic impedance $Z_n$ and the propagation constant $\gamma_n$ (n: odd) of the distributed tunnel junction element can be obtained in the following. For the SIS distributed tunnel junction transmission line shown in FIG. 3, the impedance Z and admittance Y per unit length are as follows.

$$Z = j\omega\mu_0 \frac{s}{W_J} + \frac{1}{W_J}\left(\sqrt{\frac{j\omega\mu_0}{\sigma}} \coth\left(d_{SU}\sqrt{j\omega\mu_0\sigma}\right) + \sqrt{\frac{j\omega\mu_0}{\sigma}} \coth\left(d_{SL}\sqrt{j\omega\mu_0\sigma}\right)\right) \tag{6}$$

$$Y = \frac{W_J}{R_{rf}} + j\omega C_s W_J \tag{7}$$

Where $R_{rf}$ is tunnel junction resistance per unit area, $C_s$ is distributed tunnel junction capacitance per unit area, $\sigma$ is complex electric conductivity of the superconductor, and $\eta_0$ is free space impedance, which is 377Ω. The characteristic impedance $Z_n$ and the propagation constant $\gamma_n$ (n: odd) of the SIS junction element is as follows.

$$Z_n = \sqrt{\frac{Z}{Y}} \tag{8}$$

$$\gamma_n = \sqrt{ZY} \tag{9}$$

The characteristic impedance $Z_n$ and the propagation constant $\gamma_n$ (n: even) of the microstrip line of superconductor is as follows.

$$Z_n = Z_p \sqrt{1 - jg_2 \frac{\eta_o(Z_{s1} + Z_{s2})}{\omega\mu_0 Z_p \sqrt{\varepsilon_p}}} \tag{10}$$

$$\gamma_n = jk_0\sqrt{\varepsilon_p}\sqrt{1 - j\frac{g_2\eta_0(Z_{s1} + Z_{s2})}{\omega\mu_0 Z_p \sqrt{\varepsilon_p}}} \tag{11}$$

Where $Z_p$ is characteristic impedance, $\in_p$ is effective dielectric constant as perfect conductor, and $k_0$ is wave number in free space. $Z_{s1}$ and $Z_{s2}$ are surface impedances calculated from the complex electric conductivity of the super conductor.

The form factor of the microstrip line shown in FIG. 3 is as follows.

$$g_2 = \frac{\left[\left(w' + \frac{w'}{\pi(w'/2 + 0.94)}\right)\left(1 + \frac{1}{w'} + \frac{\ln(2h/t_1) - t_1/h}{\pi w'}\right)\right]}{\left[h\left(w' + \frac{2}{\pi}\ln\left(2\pi e\left(\frac{w'}{2} + 0.94\right)\right)\right)^2\right]} \quad (12)$$

where $$w' = \frac{w + \frac{t_1}{\pi}\ln\left(\frac{2h}{t_1} + 1\right)}{h} \quad (13)$$

Figure 4A:
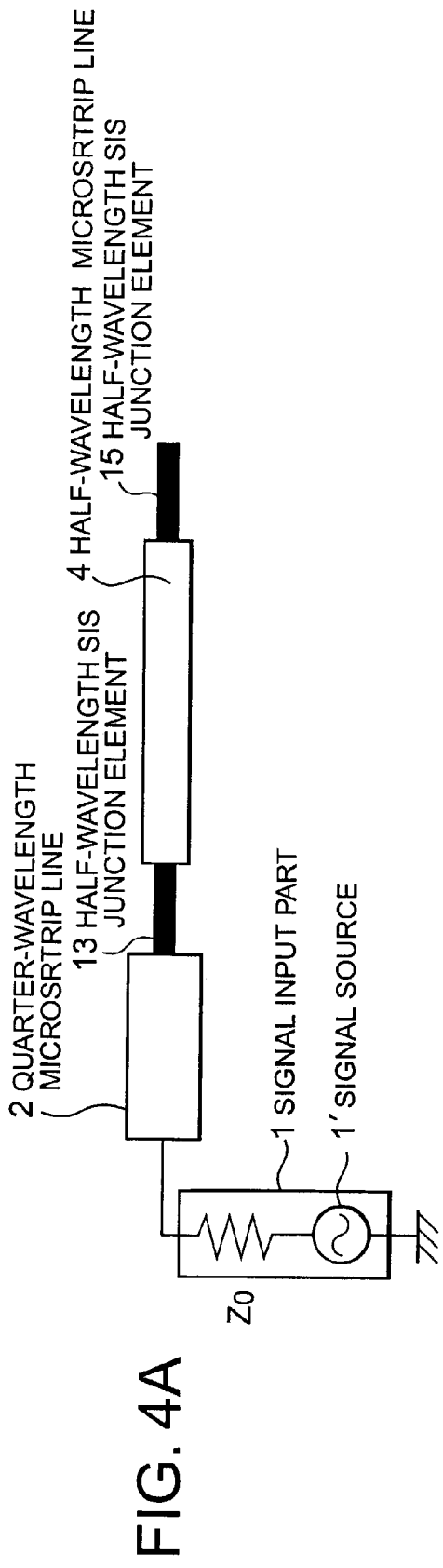
FIG. 4A shows diagram of embodiment 2 of the present invention.
Figure 4B:
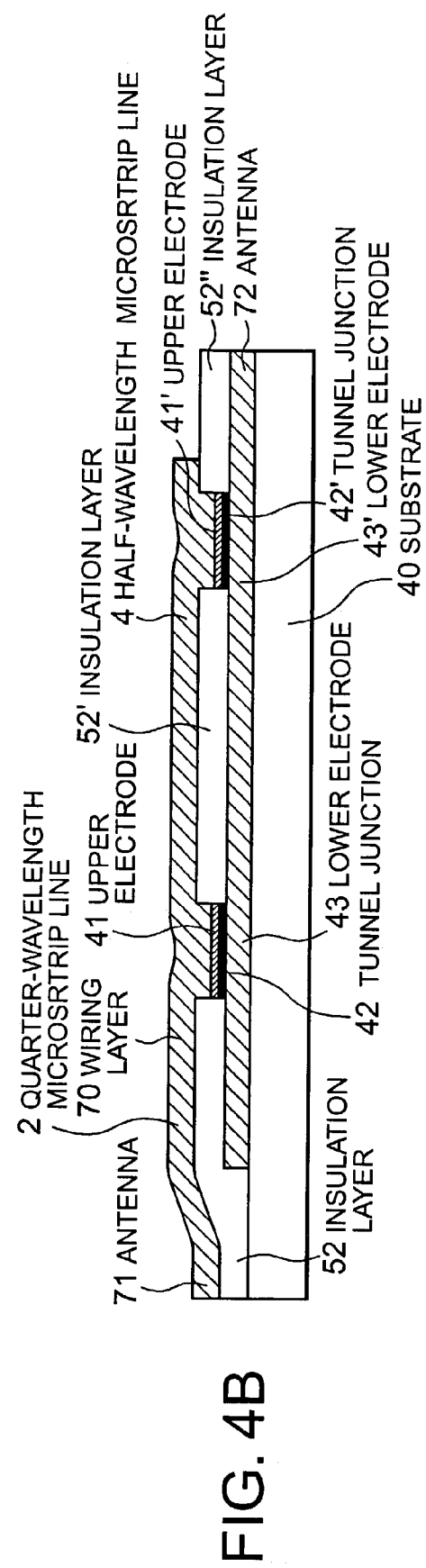
FIG. 4B shows a cross sectional view of the embodiment 2 of the present invention.

FIGS. 4A and 4B show the second embodiment of the present invention, which is a case of N=4 or m=2 in the structure shown in FIGS. 1A and 1B. The tuning circuit is composed of two distributed half-wave length SIS junction element 13 and 15, a half-wavelength microstrip line 4 and a quarter-wavelength microstrip line 2. The quarter-wavelength strip microstrip line 2 is for impedance matching between the signal source 1 and the distributed half-wavelength SIS junction element 13. FIG. 4B shows a cross sectional view of a superconductor integrate circuit comprising the tuning circuit shown in FIG. 4A. In FIG. 4B the same reference numbers with those of FIG. 1B corresponds to same parts shown in FIG. 1B. The distributed SIS junction element 13 in FIG. 4A corresponds to the SIS junction element composed of the upper electrode 41, the tunnel junction 42 and the lower electrode 43 in FIG. 4B. The distributed SIS junction element 15 in FIG. 4A corresponds to the SIS junction element composed of the upper electrode 41', the tunnel junction 42' and the lower electrode 43' in FIG. 4B. The half-wavelength microstrip line 4 and a quarter-wavelength microstrip line 2 are formed using same fabrication method and materials with the structure shown in FIG. 1B. The wiring layer 70 is arranged so as to be the antenna 71, the upper strip line of the microstrip line 2,4 and the electric wire contacted to the upper electrode 41, 41' of the SIS junction elements 13, 15. The lower electrode 43 is common electrode to the lower electrode of the microstrip line 2,4 and the lower electrode 43, 43' of the SIS junction element 13, 15 and an antenna 72.

In FIGS. 4A and 4B, the SIS junction element 13 and 15 have respectively a width of 1.2 μm and a length of 4.34 μm (half-wavelength of input signal at a center frequency). The half-wavelength microstrip line 4 has a width of 1.8 μm and a length of 92.9 μm (half-wavelength). The quarter-wavelength microstrip line 2 has a width of 5.5 μm and a length of 42.9 μm (a quarter-wavelength of input signal at a center frequency).

Figures 5A, 5B:
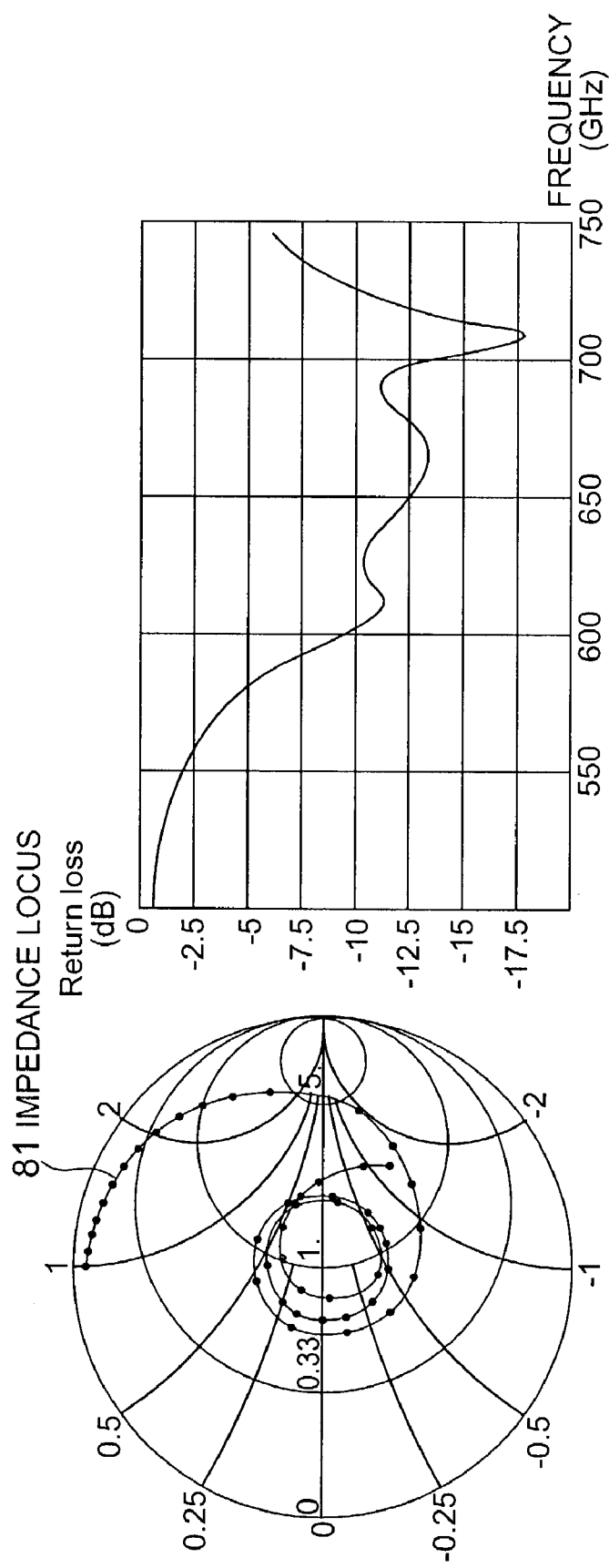
FIG. 5A shows a trajectory on Smith chart of the embodiment 2 of the present invention.
FIG. 5B shows characteristics of the return loss of the embodiment 2.

FIGS. 5A and 5B show characteristics of the tuning circuit calculated with the above mentioned equation. Physical constants of the SIS junction element and the superconductor Nb used to calculate the characteristics are in the following.

The gap frequency, which corresponds to the energy band of Nb), is 700 GHz, the electric conductivity at the lowest temperature broken the superconductivity is $1.2 \times 10^7 \Omega^{-1} m^{-1}$, the thickness of the upper electrode is 500 nm, the thickness of the lower electrode is 200 nm, the thickness of the tunnel electrode 1 nm, current density $J_c=5$ kA/cm² (the maximum current density to conserve superconductivity), $I_c R_N = 1.9$ mV, characteristic capacity fF/μm². The $Z_n$, $\gamma_n$ and $d_n$ are selected so as that the reflection coefficient Γ is within allowable range less than −10 dB.

FIG. 5A shows an impedance locus 81 obtained changing frequency on Smith chart. FIG. 5B shows return loss to the frequency change. The frequency band corresponding to the return loss less than −10 dB is about 600 GHz–725 GHz on FIG. 5B. The frequency band of the present invention is very wider than that of prior art. The impedance locus is converged within a circle less than −10 dB, and it shows that the desired characteristics with return loss of less than −10 dB can be designed easily with the present invention.

According to the present invention, the half-wavelength components acts as a band-pass filter, and each SIS junction element consumes each power to make the band-pass-filter broad band. So the broad band tuning circuit is realized with the present invention, even if the current density of the SIS junction element is small.

In the following the tuning circuit of the present invention will be explained in more detail. FIGS. 6A,6B–FIG. 13 are referred in the explanation.

Figure 6B:
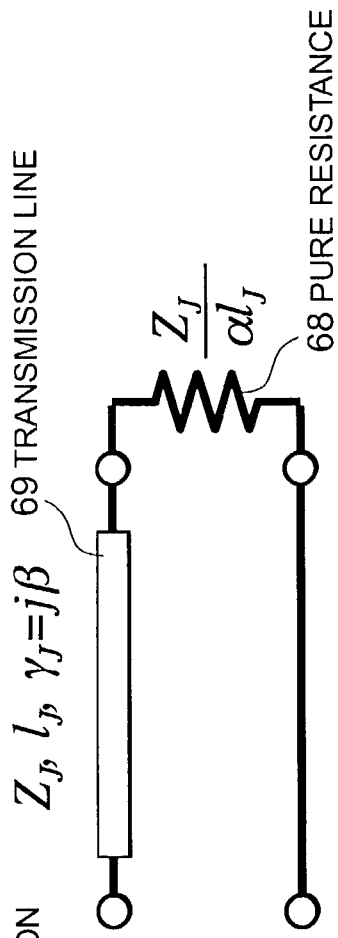
FIG. 6B shows a drawing of an equivalent circuit to the transmission line shown in FIG. 6A to explain in detail a principle of the present invention.
Figure 6A:
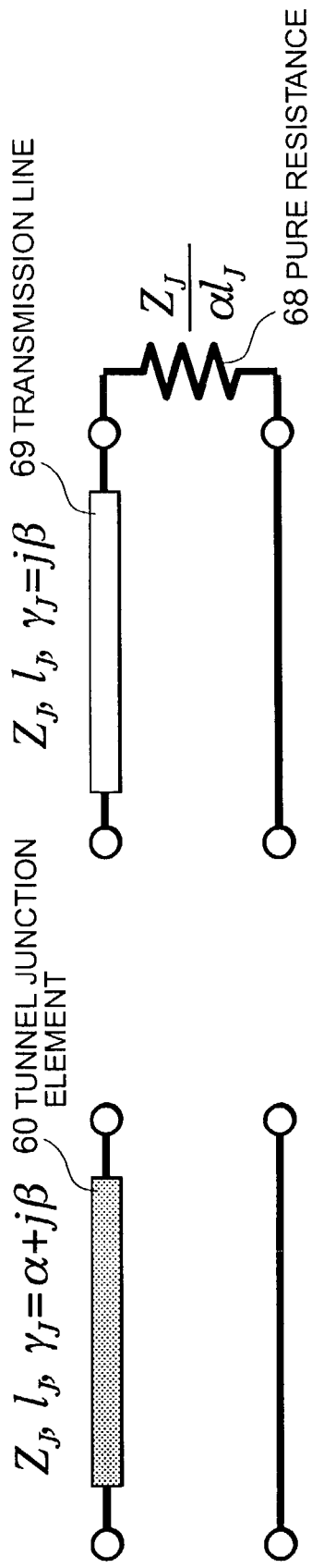
FIG. 6A shows a drawing of a circuit model to explain in detail a principle of the present invention.
Figure 7:
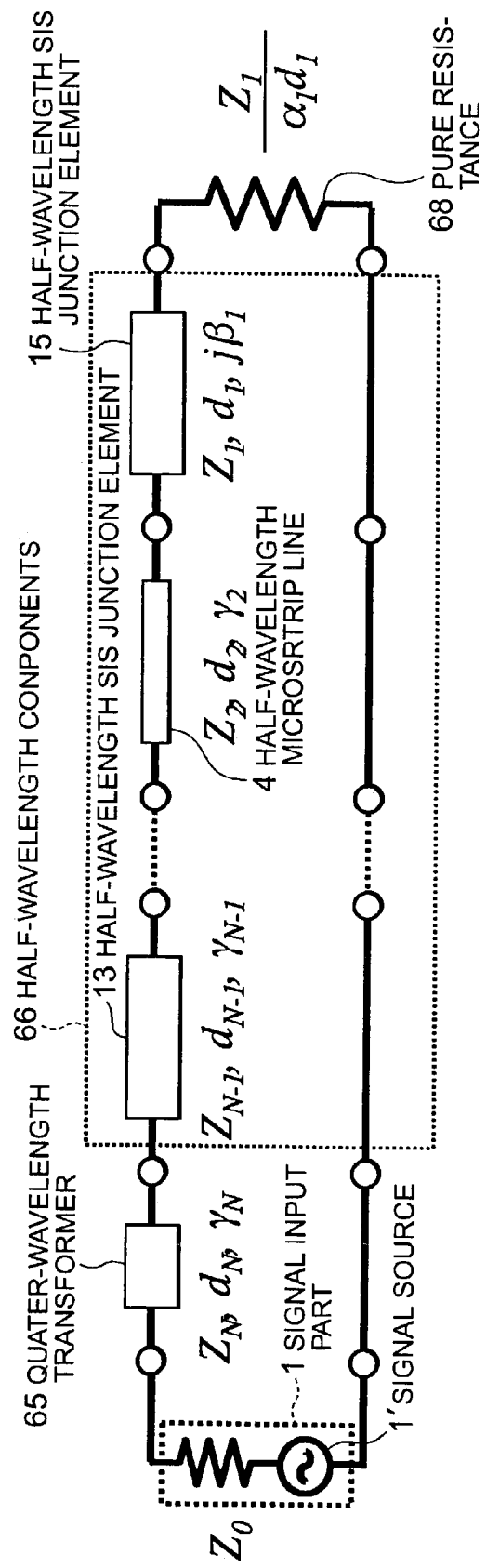
FIG. 7 shows a drawing of a structure of distributed tunnel junction elements and microstrip lines.
Figure 8:
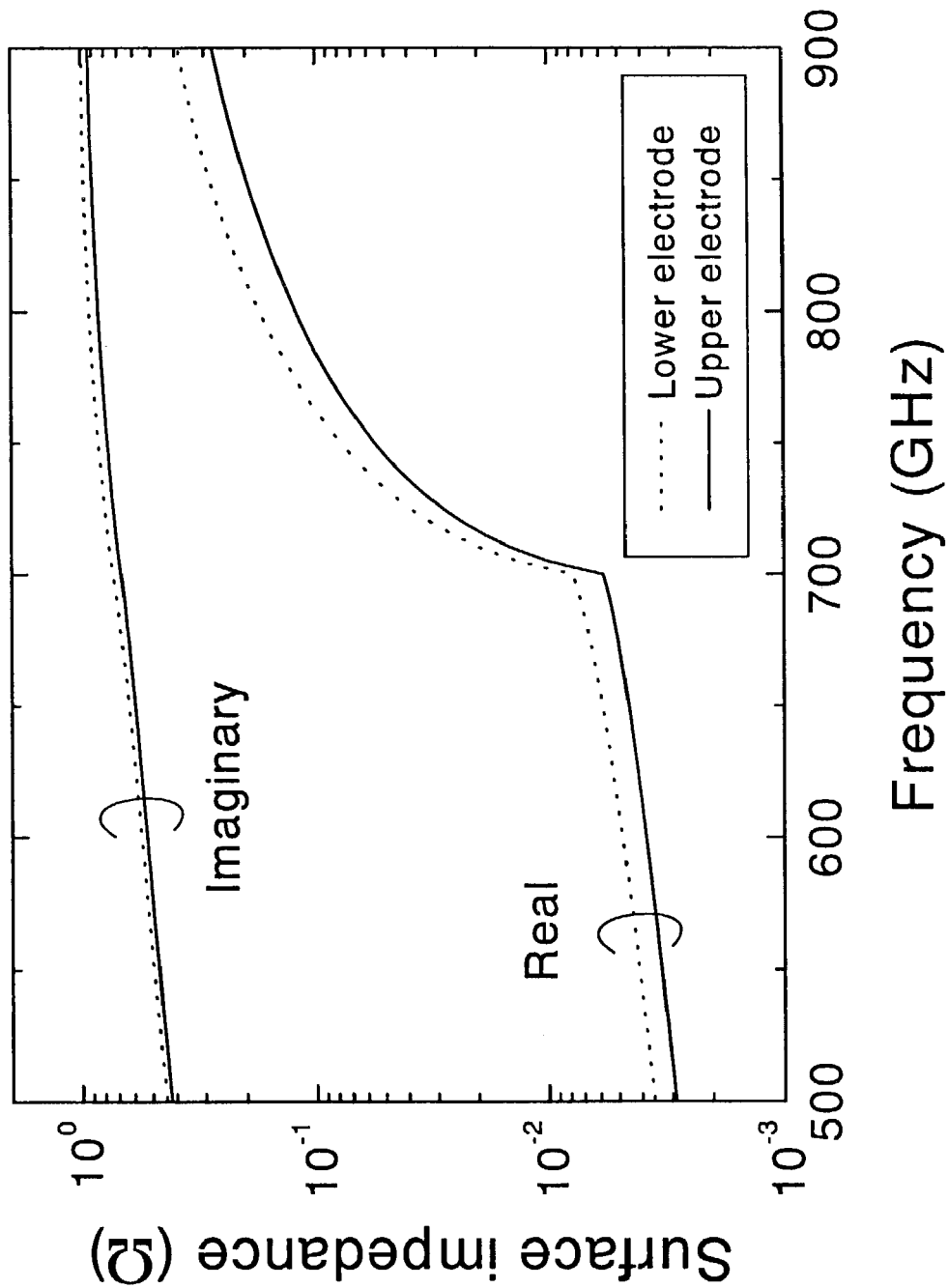
FIG. 8 shows characteristic of the surface impedances of the upper and lower electrode to frequency.
Figure 9:
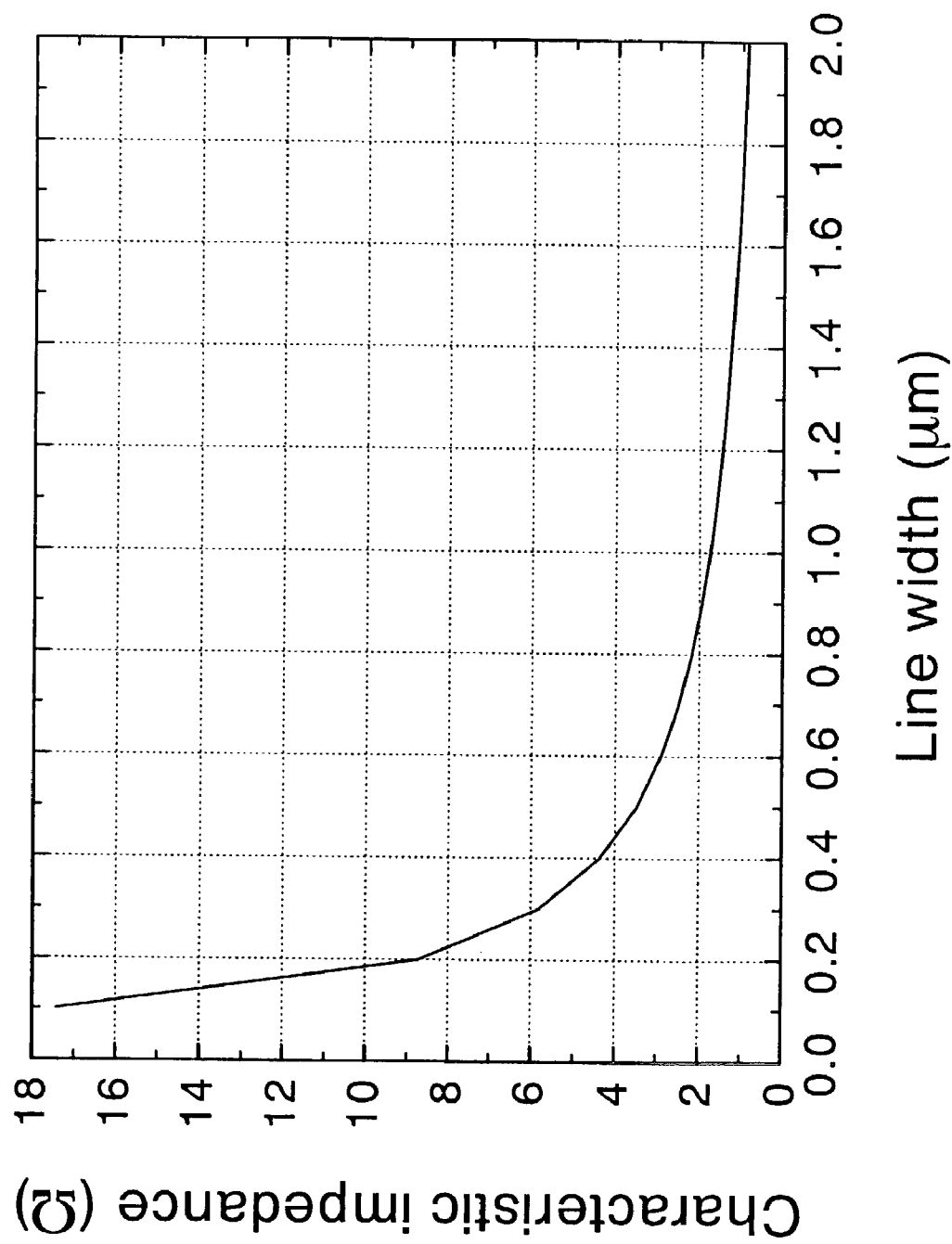
FIG. 9 shows characteristic impedance of the distributed tunnel junction element to frequency.
Figure 10:
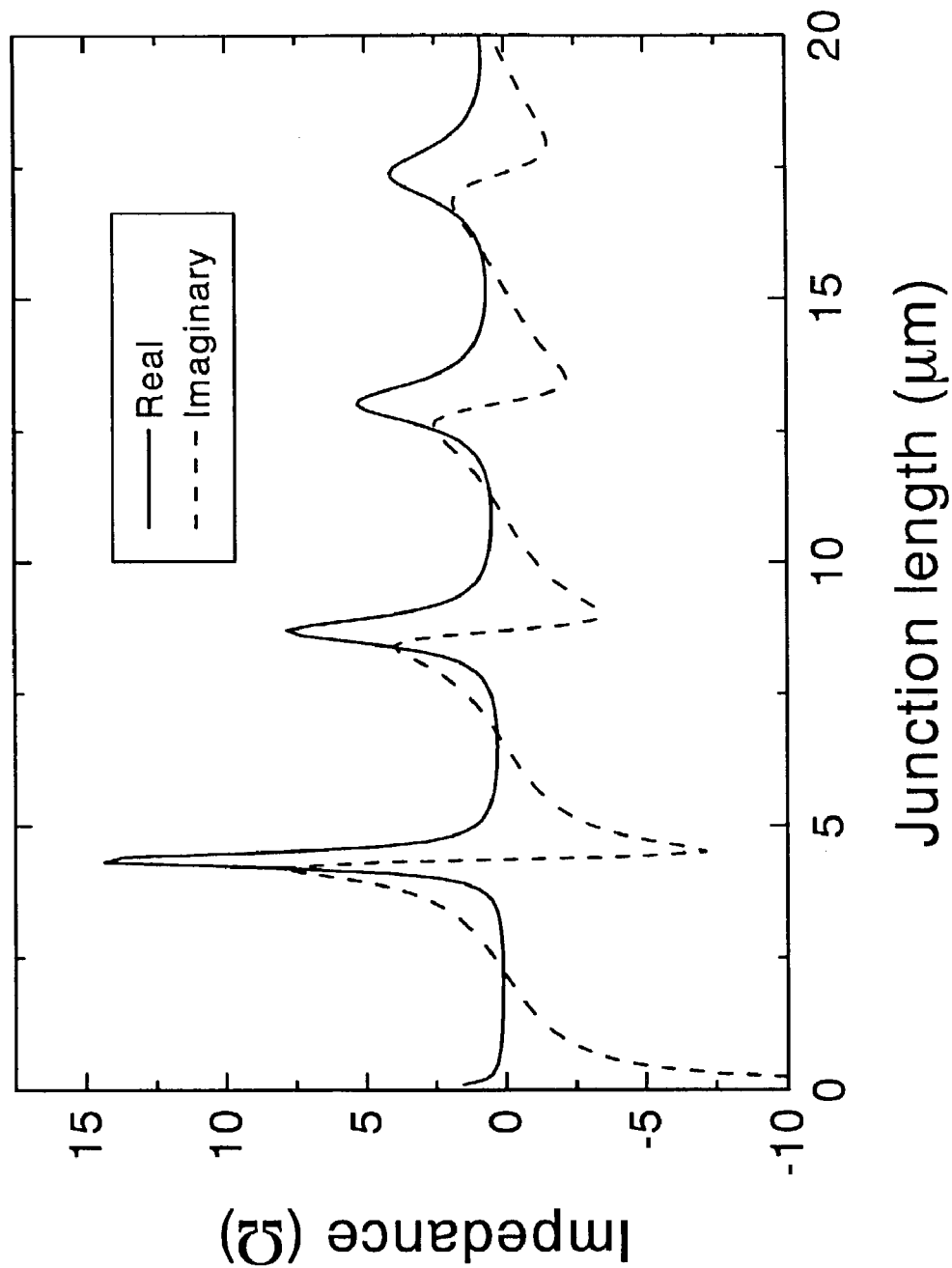
FIG. 10 shows characteristic of impedance of distributed tunnel junction to frequency.
Figure 11:
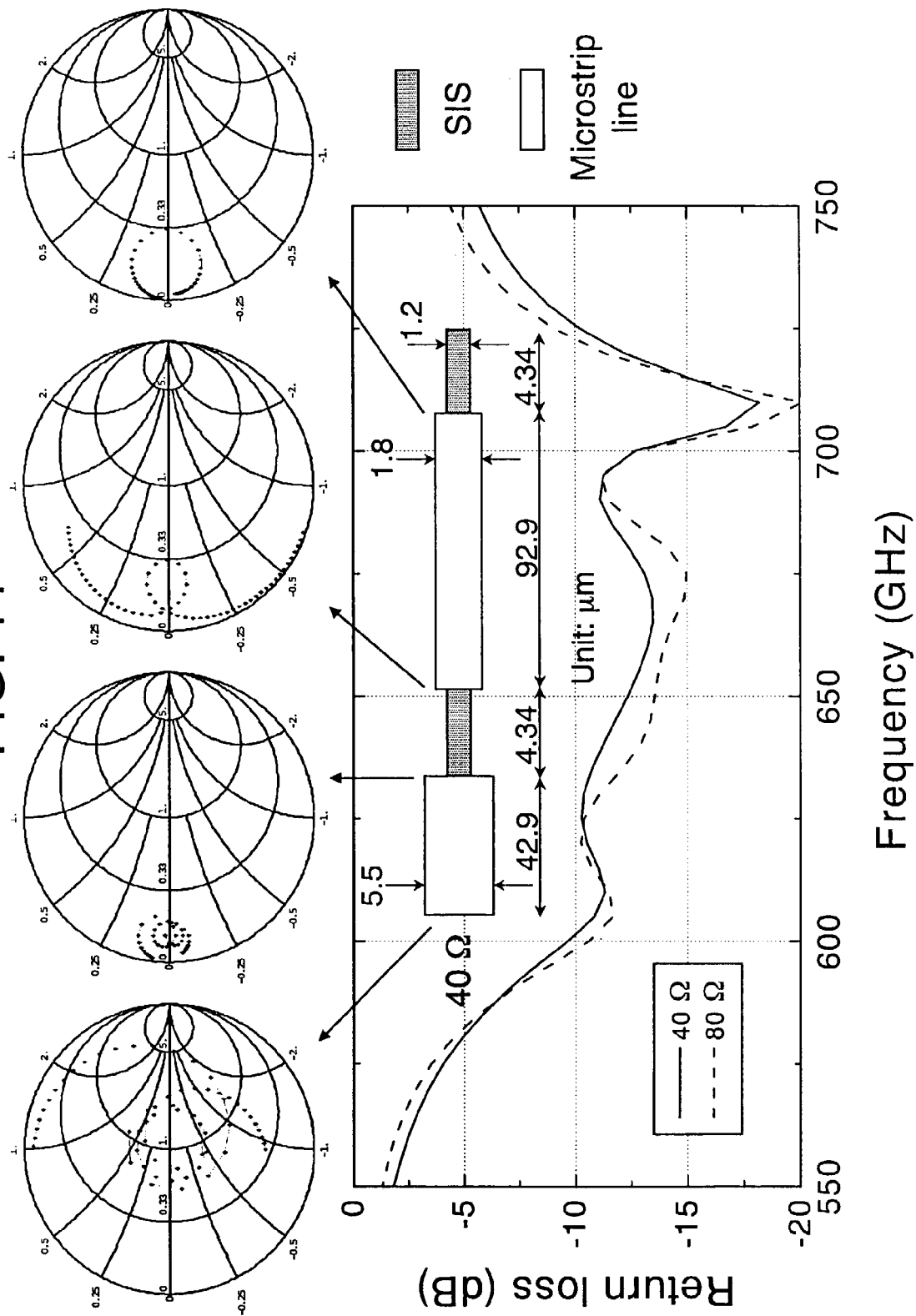
FIG. 11 shows characteristic of return loss of the tuning circuit to frequency.
Figure 12:
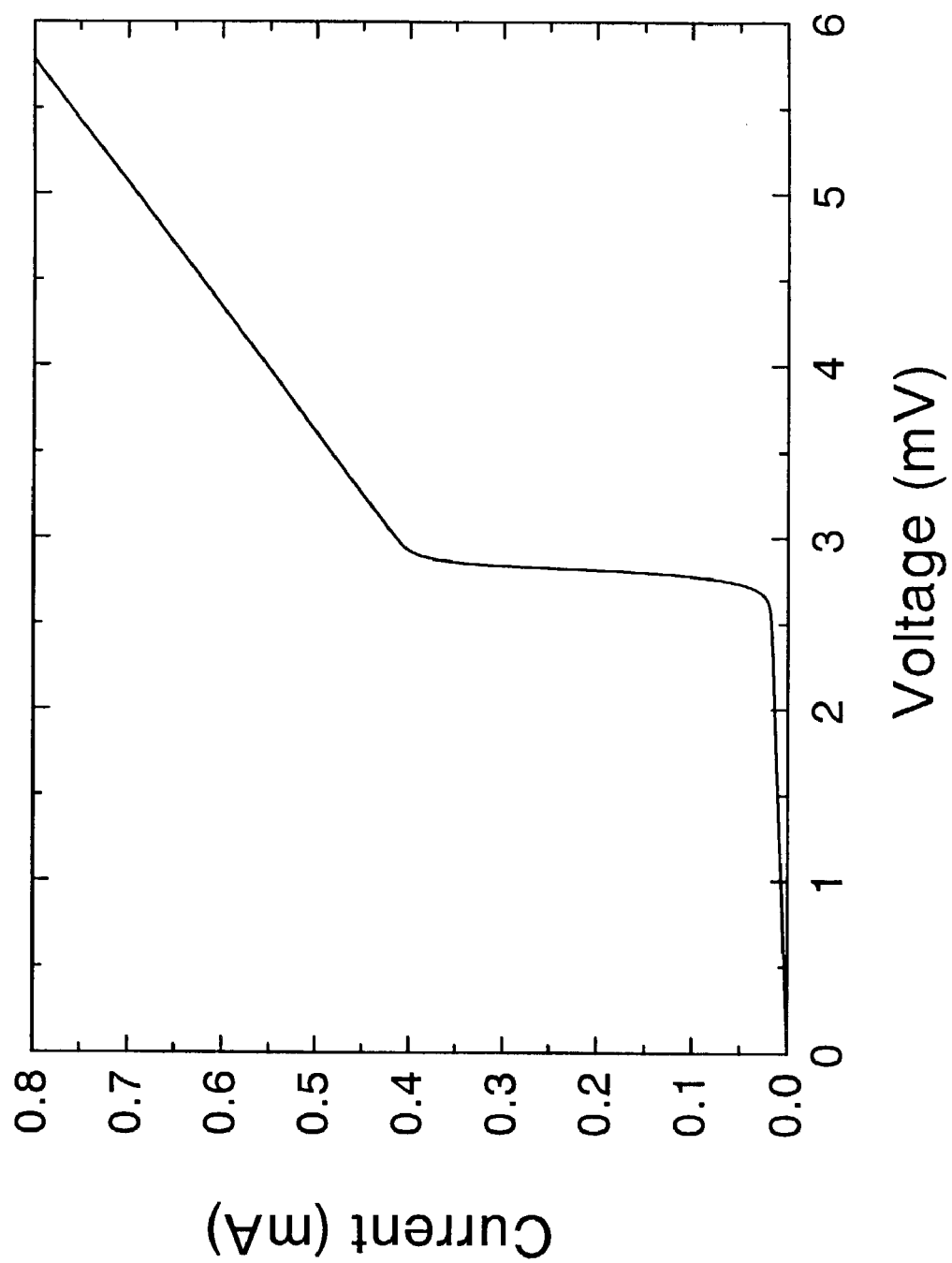
FIG. 12 shows characteristic of current to voltage of the tunnel junction element.
Figure 13:
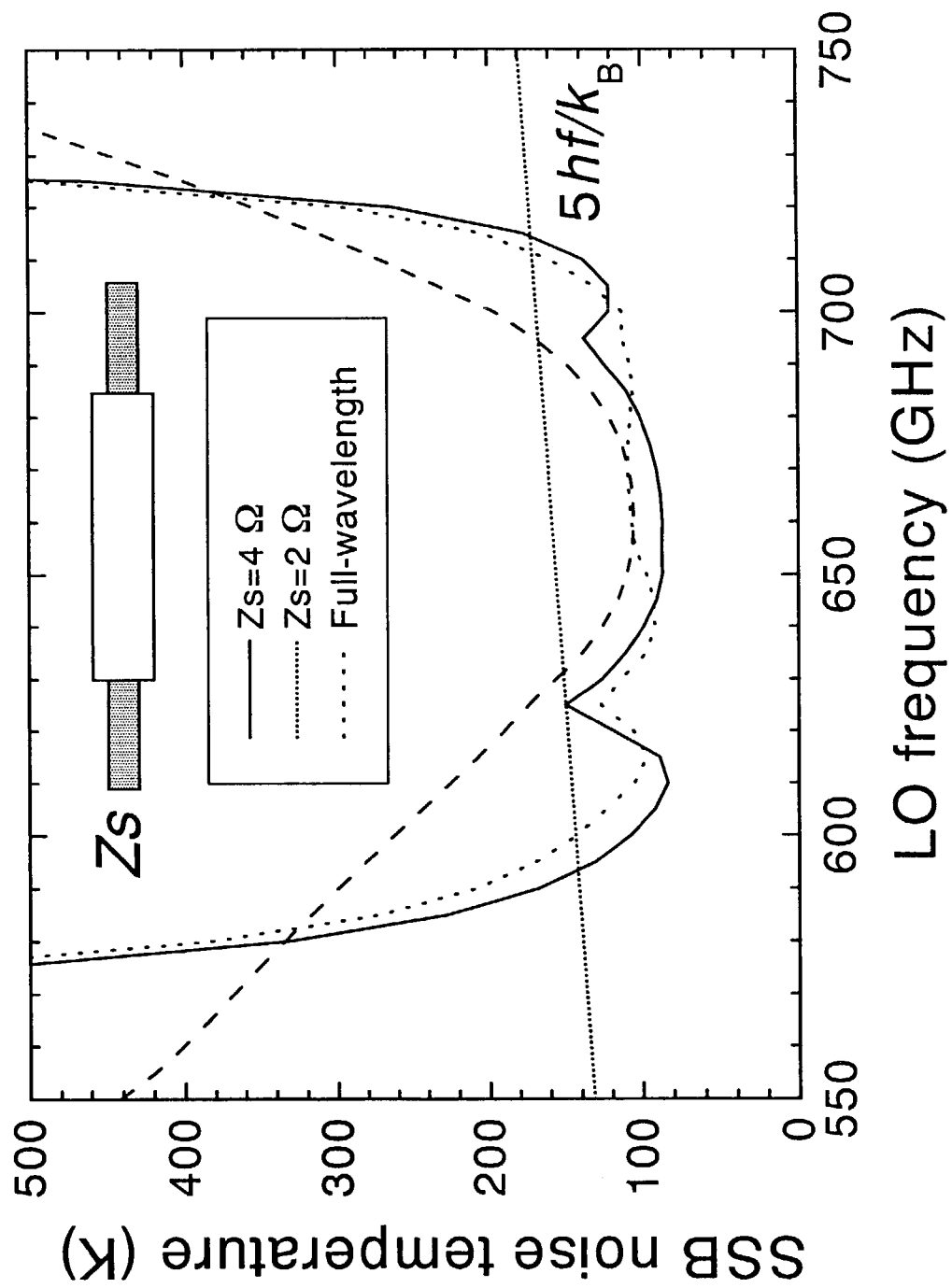
FIG. 13 shows characteristic of noise temperature to local oscillation frequency of mixer with two half-wavelength distributed junction elements.
Figure 14:
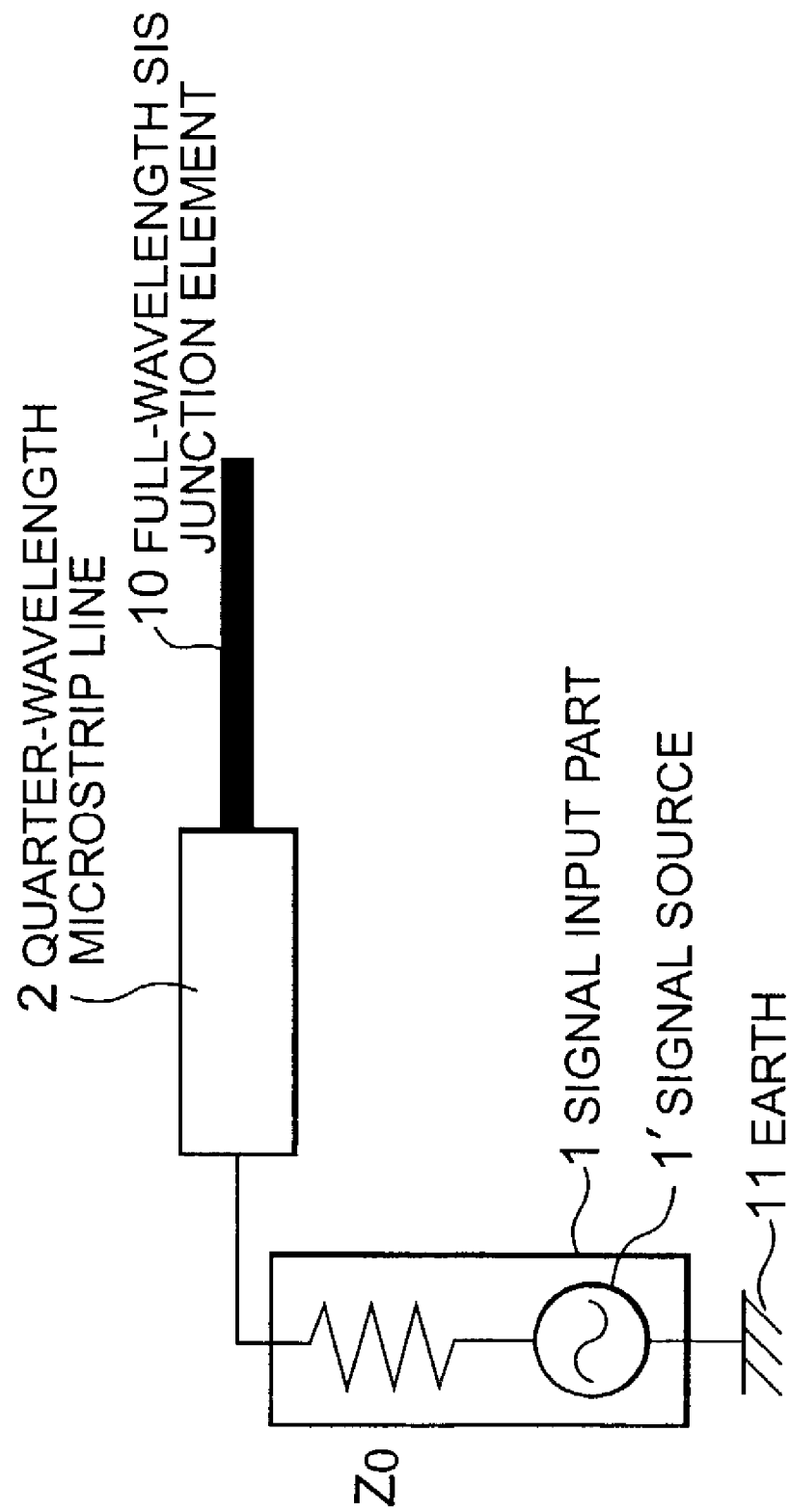
FIG. 14 shows a diagram of prior art tuning circuit with tunnel junction element.

FIG. 6A shows a circuit model of open-ended distributed tunnel junction with parameters of transmission line. FIG. 6B shows an equivalent circuit for a low-pass transmission line. FIG. 7 shows a tuning circuit composed of distributed half-wavelength tunnel junctions and half-wavelength microstrip lines equivalent to the tuning circuit shown in FIG. 1A. FIG. 8 shows the surfaces impedances of the upper and lower electrodes as functions of frequency. FIG. 9 shows the characteristic impedance of distributed tunnel junction with current density of 5 kA/cm² as a function of line width. FIG. 10 shows the input impedance of distributed tunnel junction as a function of junction length. FIG. 11 shows a layout, theoretical return loss of tuning circuit, and impedance loci toward load at each position, normalized to 40Ω. FIG. 12 shows I–V characteristics of Nb SIS junctions used in noise simulation. Subgap-to-normal state-resistance ratio (the ratio of current at 3 mV to at 2 mV) was about 20. FIG. 13 shows simulated receiver noise temperature of mixer with two half-wavelength distributed junctions, and also shows the noise temperature of conventional full-wavelength SIS mixer with the same current density.

The tuning circuit comprising the SIS junction elements can be used as mixers (later referred to as SIS mixer), and the mixers have shown high sensitivity approaching a quantum limit at millimeter and submillimeter wavelengths. Recent radio-astronomy projects, such as the Atacama Large Millimeter Array (ALMA) and the Herschel Space Observatory, demand not only low-noise performance but also broadband operation. Most of the frequency bands specified for these projects are large fractional bandwidths of about 20% or larger.

In general, the fractional tuning bandwidth of SIS mixers, $\Delta f/f_0$, is roughly equal to $1/\omega C_J R_N$ (=1/(Q factor) for a resonant circuit), where ω, $C_J$, and $R_N$ are the signal angular frequency, geometrical junction capacitance, and normal resistance of the junction, respectively (see reference 1). To cover the high-frequency bands such as band 9 (600–720 GHz) and band 10 (787–950 GHz) of the ALMA, for example, the $\omega C_J R_N$ of the SIS junction element must be about 5 at each center frequency. From this, the required critical current density of the junction is derived according to the relation $J_C = \omega C_S I_C R_N/(\omega R_N C_J)$, where $C_S$ and $I_C$ are the specific capacitances of the junction and critical current, respectively (see reference 2). Assuming that the junction specific capacitance is 100 fF/μm², the required current density for band 9 is about 15 kA/cm² for Nb tunnel junctions and about 30 kA/cm² for NbN tunnel junctions. For band 10, a junction with a higher $J_C$ is needed. The higher the current density, however, the lower the quality of dc characteristic $C_S$ of junctions (i.e., the larger the sub-gap leakage current), which degrades mixer performance.

To achieve SIS mixers having virtually no bandwidth limitation with low-current-density junctions, traveling-wave mixers using distributed long junctions (a few times of the guided wavelength λg, e.g., 40 μm long or about 2.5 λg at 460 GHz for Nb/AlO$_x$/Nb junctions in references 3 and 4) were developed at submillimeter-wave frequencies. However, the Nb distributed long junction (fabricated using electron beam lithography) must be very narrow, around 0.2 μm, to achieve a characteristic impedance sufficiently high to match the source impedance.

To obtain high input impedance with a wide junction (≈1 μm) using conventional photolithography techniques, a resonant distributed SIS mixer (half or one guided wavelength) was proposed and tested(see reference 5–7). However, its fractional bandwidth is narrow when low current-density SIS junction elements are used because the bandwidth is largely governed by the Q-factor of the distributed junction elements, similar to that of a conventional lumped element mixer. Using a conventional tuning configuration consisting of a resonant SIS junction with a quarter-wavelength impedance transformer, that is quarter-wavelength microstrip line, we can control the matching bandwidth by adjusting only the current density of the junction. In summary, high-current-density junctions are needed to achieve broadband operation at submillimeter wavelengths (see reference 8).

To achieve broadband operation of SIS mixers with relatively low-current-density junctions, a better tuning circuit design should be implemented. In the following, the design and analysis of a tuning circuit using distributed SIS junctions that has a fractional bandwidth broader than $1/\omega C_J R_N$ is explained in more detail. Assuming a practical material of Nb, the SIS mixer was designed at submillimeter-wave frequencies. Numerical calculations based on Tucker's quantum theory of mixing suggest that better broadband and low noise characteristic $C_S$ can be achieved with this new mixer, compared to conventional SIS mixers with the same current density (see reference 9).

The design principle will be explained. A broadband matching circuit between a constant source resistance and a resistive load can be designed based on Chebyshev's theory and similar theories (10). When designing a broadband matching circuit for the load of a distributed tunnel junction, we must take into account the frequency-dependent impedance of the load. Since a distributed tunnel junction can be treated as a lossy microstrip line due to its quasi-particle tunneling loss, describe the behavior of distributed tunnel junctions can be described by using simple parameters such as the characteristic impedance and the propagation constant.

FIG. 6A illustrates a distributed tunnel junction element 60, in which $Z_J$, $\gamma_J(=\alpha+j\beta)$, and $l_J$ represent, respectively, the characteristic impedance, propagation constant (α is quasi-particle loss and β is the phase constant below the gap frequency), and length of the transmission line composed of the tunnel junction element. According to the simple transmission theory, the input impedance of an open-ended distributed SIS junction is expressed by $$Z_{in} = Z_J \cot h(\gamma_J l_J) \tag{14}$$

If the transmission line has low loss [sin(αl$_J$)≈αl$_J$], the equation can be rewritten as $$Z_{in} = Z_J \frac{Z_J}{\alpha l_J} \cos(\beta l_J) + \frac{jZ_J \sin(\beta l_J)}{Z_J \cos(\beta l_J) + j\frac{Z_J}{\alpha l_J}\sin(\beta l_J)} \tag{15}$$

This equation shows that the input impedance of an open-ended tunnel junction element, that is SIS junction element, is equivalent to that of a loss-free transmission line (α=0) end-loaded with a pure resistance 68 of $Z_J/\alpha l_J$, as shown in FIG. 6B. Accordingly, the frequency-dependent impedance of the SIS transmission line can be simply understood as the frequency-dependent reactance component varied in a loss-free transmission line. One solution for broadband by efficient reactance compensation is to use a band-pass-filter structure consisting of half-wavelength components, which can control the impedance characteristics $C_S$ to produce a bandwidth within a prescribed tolerance, based on Chebyshev's theory and those of others.

Band-pass filters usually consist of alternating low impedance and high-impedance sections. Moreover distributed tunnel junctions have low characteristic impedance, microstrip lines is used for the high-impedance sections. Based on the consideration the structure of distributed junctions and microstrip lines of the present invention shown in FIG. 7 is invented and proposed.

In FIG. 7 a quarter-wavelength transformer 65 is composed of a quarter-wave microstrip line for impedance transformation, half-wavelength components 66 are composed of half-wavelength SIS junction elements 13,15 and half wave microstrip line 4 etc., the signal input part 1 composing a signal source 1' having inner impedance $Z_0$ and pure resistance 68. In FIG. 7, $Z_n$, $\gamma_n$ and $d_n$ are the characteristic impedance of the nth element from the open end, the propagation constant, and the length respectively. Further, $Z^{in(n)}$ is the input impedance seen at the boundary between the nth and n+1th junctions to the open end in FIG. 7. The odd and even elements represent half-wavelength distributed tunnel junction elements and half-wavelength microstrip lines, respectively. The Nth element (N is even) is quarter-wavelength impedance transformer 65 for matching the tuning circuit of half-wavelength components 66 to source impedance $Z_0$. The reflection coefficient between $Z_0$ and the input impedance of the N-section circuit will be shown in the followings. According to the simple transmission theory, the input impedance of the N section circuit can be calculated with the following recursive formulas.

$$Z_{in}^{(1)} = Z_1 \cot h(\gamma_1 d_1) \tag{16}$$

$$Z_{in}^{(n)} = Z_n Z_{in}^{(n-1)} + \frac{Z_n \tanh(\gamma_n d_n)}{Z_n + Z_{in}^{(n-1)} \tanh(\gamma_n d_n)} \tag{17}$$

Accordingly, reflection coefficient Γ is given by $$\Gamma = \frac{Z_0 - Z_{in}^{(n)}}{Z_0 + Z_{in}^{(N)}} \tag{18}$$

Thus, the broadband matching design for the condition of a maximum tolerable |Γm| can be optimized by changing the parameters $Z_n$, $\gamma_n$, and $d_n$. The calculations of the characteristic impedance and the propagation constant for the distributed junctions and the superconducting microstrip lines were described by the inventors of the present invention (see reference 11).

Based on the above mentioned theory, the inventors of the present invention designed an SIS mixer made of Nb with two distributed SIS junctions (N=4) that operates at a center frequency of 660 GHz (ALMA Band 9) as an example. The modeled SIS junctions and microstrip lines are Nb/AlOx/Nb and Nb/SiO/Nb, respectively. These elements have been widely used in practical SIS mixers and are well characterized. A linear transmission model containing a tunnel barrier (see references 12,4) for the distributed SIS tunnel junctions was used. In this approach, it is assumed that the quasi-particle tunneling current is introduced into the superconducting microstrip line as a constant, uniform conductance of $1/R_{NU}$ per unit length, where $R_{NU}$ is the normal state resistance per unit area, and is derived according to the relation $R_{NU}=I_C R_N/J_C$. The value of $I_C R_N$ for each Nb junction was typically assumed to be 1.9 mV. A current density of 5 kA/cm$^2$ was used for the design process. We also assumed that $C_S$ for the Nb junctions is 100 fF/μm$^2$. The material parameters of the Nb tunnel junction and microstrip line used for the calculation are summarized as follows.

| | |
|---|---|
| Nb gap frequency: | 700 GHz |
| Normal state conductivity: | 1.2 × 10$^7$ Ω$^{-1}$m$^{-1}$ |
| Upper electrode thickness: | 500 nm |
| Lower electrode thickness: | 200 nm |
| SiO insulator thickness: | 440 nm |
| Nb/AlO$_x$/Nb current density: | 5 kA/cm$^2$ |
| J$_C$ R$_N$A product: | 1.9 mV |
| Specific capacitance: | 100 fF/μm$^2$ |
| AlO$_x$ barrier thickness: | 1 nm |
| ω C$_J$R$_N$ product: | 15.8 at 660 GHz |

FIG. 8 shows the calculated surface impedances of both electrodes as functions of frequency. The surface impedance of the upper and lower electrodes was calculated using the Mattis-Bardeen theory of the anomalous skin effect (see reference 13). FIG. 8 shows the calculated result, and that the surface resistances were less than 0.01Ω at frequencies below the gap frequency. However, the surface loss in the electrodes increases above the gap frequency due to pair breaking, which degrades the mixer performance.

FIG. 9 shows the calculated characteristic impedance of the distributed tunnel junction as a function of the line width at 660 GHz. The impedance was low even when the lines were narrow. Using conventional photolithography, which produces a minimum line width of around 1 μm, we only obtain a low impedance below 2Ω.

FIG. 10 shows the calculated input impedance of a 1-μm-wide open-ended SIS transmission line as a function of junction length at 660 GHz. The peaks in the real part of the impedance (where the reactance vanishes) occurred at each half-wave resonance and decayed with increasing length due to the quasi-particle loss of the SIS transmission lines. The half-wavelength of a distributed junction at 660 GHz is thus about 4.34 μm. The quasi-particle loss in the half-wavelength line, that is $αl_J$ in eq. (15), for the given current density was of the order of 10$^{-1}$, thus the model described by eq. (15) can be applied to this circuit.

It is assumed that is two source impedances of 40 and 80Ω, which are typical source impedances of waveguide feed points and quasi-optical antennas. The dimensions of the tuning circuit has been decided for each source impedance by numerical calculation, so that the bandwidth defined by the reflection coefficient below −10 dB (|Γml|<−10 dB) was as broad as possible. To simplify the calculation, the lengths of each section were fixed to one-half or one-quarter-wavelength. The inventors of the present invention optimized the circuit design by changing the widths, i.e., the characteristic impedances of each section. Two junctions are designed to be the same size each other so as to obtain the same critical current in order to be able to suppress them easily by applying magnetic field.

The diagram in FIG. 11 shows the tuning circuit designed with the above mentioned policy. It consists of two distributed SIS junctions connected by half-wavelength microstrip line and an impedance transformer for a source impedance of 40Ω. The characteristic impedances of the half-wave microstrip line between each SIS junction and the quarter-wave transformer, that is a quarter wavelength microstrip line, were 30Ω and 13Ω. Also shown in the FIG. 11 are impedance loci toward the load at each position of the circuit. It shows that the reactance component was well compensated for with this tuning circuit despite the fact that the characteristic impedance of the distributed junctions was quite low, 1.45Ω. It should be noted that a junction width of 1.2 μm is easily achieved with conventional photolithography. The calculated return loss as a function of frequency in the graph shows broadband matching below −10 dB from 600 to 725 GHz. To cover ALMA band 9, the proposed SIS mixer needs a junction current density of only 5 kA/cm$^2$. Compared with a roughly estimated value of 15 kA/cm$^2$ from $1/ωC_J R_N$ for a conventional SIS mixer, the current density can be reduced by a factor of 3. As shown in the FIG. 11, almost identical bandwidths for the source impedances of 40 and 80Ω can be achieved. For a source impedance of 80 Ω, the characteristic impedances of the microstrip lines is designed to be 35.5Ω (1.4 μm wide) for the half-wave-length line and 18.8Ω (3.5 μm wide) for the quarter-wavelength line. As mentioned above, the tuning of the circuit is flexible for various source impedances according to the present invention.

The performance of the embodiment as a mixer will be explained. The inventors of the present invention numerically simulated the mixing properties of the distributed SIS mixer using Tucker's quantum theory of mixing (see reference 9). Equivalent large and small signal models for the mixer were established by replacing the model of inhomogeneous junction arrays based on lumped elements (see reference 1) with a distributed element model, as described by Tong et al (see reference 14). Each section of the tunnel junctions was divided into 16 cells, a sufficient number for analyzing quasi-particle nonlinear transmission lines (see reference 14). In these lines, each cell must be driven by a different LO (Local Oscillation) phase and amplitude. It is assumed that an LO drive strength with a zero phase is at the open end of the mixer, and then that the conversion admittance matrices for each cell is derived recursively according to transmission theory. The correlation matrices were derived from only LO amplitude for each cell, based on the assumption that shot noise generated at any point along a nonlinear transmission line is not correlated with shot noise generated at any other point (see reference 14). A quasi-five-port approximation is used and the fundamental frequency sidebands, the second harmonic sidebands, and the IF frequency were taken into account in the approximation (see reference 15). The IF frequency was assumed to be 1.5 GHz, and the IF termination was assumed to be 50Ω. The dc characteristic of a typical Nb SIS junction, as shown in FIG. 12, was used. The subgap-to-normal state-resistance ratio at 2 mV (ratio of the current at 4 mV to at 2 mv) was about 20.

A simplified model without quarter-wavelength transformer is used to calculate the mixing properties of the mixer. A constant source impedance of 4Ω was assumed across the entire frequency band for a circuit consisting of half-wavelength components because the quarter-wavelength microstrip line transforms a waveguide source impedance of 40Ω to about 4Ω at the center frequency. FIG. 13 shows the calculated SSB receiver noise temperature. Note that the dc bias and LO strength across the last cell were optimized with respect to the receiver noise temperature at each simulated frequency by assuming a noise temperature of the IF amplifier of 2K. It shows that there were two noise ripples, one at around 620 GHz, and the other at around 690 GHz. However the inventors of the present invention found that this could be reduced by assuming a lower source impedance of 2Ω, as shown in FIG. 13, but the bandwidth became slightly narrow because the matching degraded. If junctions with a different width are used, the ripples can be reduced without impairing broadband matching.

To compare the performance of the mixer of the present invention with that of other types of mixers, the inventor of the present invention simulated the mixing properties of a full-wavelength resonant distributed SIS mixer with the same current density, 5 kA/cm². As shown in FIG. 13, the receiver noise bandwidth of the proposed mixer of the present invention was broader than that of the conventional mixer, as predicted from the design, whereas the total length of the distributed junction was the same. Evaluating the bandwidth by the noise temperature below 5 $hf/k_B$ (about twice the minimum noise temperatures of these receivers), the improvement is by a factor of 1.9, where h, f, and $k_B$ express the Plank's constant, the operating frequency, and the Boltzmann's constant, respectively. However, FIG. 13 shows the frequency dependence of the receiver noise temperature is not symmetrical at the center frequency of 660 GHz. This is because the surface loss of Nb electrodes increases above the gap frequency (700 GHz) as shown in FIG. 13. Since the total length of this circuit is longer than those of conventional circuits, noise performance degrades rapidly above the gap frequency, which is the disadvantage of this tuning method. Below the gap frequency, however, this tuning method using effective reactance compensation can reduce the current density and obtain broadband characteristics.

The present invention provides a broadband tuning circuit that enables the use of lower current density junctions. It utilizes the efficient reactance compensation produced by two half-wavelength distributed junctions connected by half-wavelength microstrip line. Based on the design and simulated noise performance, It is predicted that a tuning circuit using Nb junctions with a current density of 5 kA/cm² can cover the entire 660 GHz band (600–720 GHz) with a SSB receiver noise temperature below 5 $hf/k_B$. The proposed tuning circuit may also be useful for NbN-based SIS mixers with low-current-density junctions at frequencies up to a gap frequency of 1.4 THz.

The many features and advantages of the present invention are apparent from the detailed specification and, thus, it is intended by the appended claims to cover all such features and advantages of the invention which fall within the true spirit and scope of the invention. Further, since numerous modification and changes will readily occur to those skilled in the art, it is not desired to limit the invention to the exact construction and operation illustrated and described, and accordingly all suitable modification and equivalents falling within the scope of the invention may be included in the present invention.

What is claimed is:

1. A tuning circuit, comprising:
   at least a superconductor microstrip line; and
   at least two superconductor distributed tunnel junction elements,
   wherein the microstrip line and the tunnel junction elements are connected alternately, the microstrip line is a half-wavelength microstrip line, and the tunnel junction elements are half-wavelength tunnel junction elements.

2. The tuning circuit of claim 1, wherein the at least one superconductor microstrip line and the at least two superconductor distributed tunnel junction elements include N/2 half-wavelength tunnel junction elements, N/2−1 half-wavelength microstrip lines, and one quarter-wavelength microstrip line; and
   the first tunnel junction element is connected to a signal output part, the Nth component from the first tunnel junction element is the quarter-wavelength microstrip line for impedance matching, and the quarter-wavelength microstrip line is connected to an input signal part.

3. A tuning circuit, comprising:
   at least a superconductor microstrip line; and
   at least two superconductor distributed tunnel junction elements,
   wherein the microstrip line and the tunnel junction elements are connected alternately and the tuning circuit acts as a mixer circuit, so that, when a signal and a local signal of different frequency with the signal are input, the frequency difference between the signal and a local oscillation signal is output.

4. A superconductor integrated circuit, comprising:
   at least one superconductor microstrip line; and
   at least two superconductor distributed tunnel junction elements, wherein
   the microstrip line and the tunnel junction elements are connected alternately;
   the microstrip line is composed of an upper strip line to act as the microstrip line and a lower electrode;
   the distributed tunnel junction elements are composed of an upper electrode, a lower electrode, and a distributed tunnel junction between the upper electrode and the lower electrode;
   a superconductor layer of a common electrode of the lower electrode of the tunnel junction elements and the lower electrode of the strip line is layered on a substrate;
   an insulation layer is layered on the superconductor layer of the common electrode;
   the tunnel junction and the upper electrode of the tunnel junction element are arranged on the common lower electrode through a contact hole of the insulation layer; and
   the upper line of the microstrip line contacts the upper electrode of the tunnel junction element through the contact hole of the insulation layer.

5. The superconductor integrated circuit of claim 4, wherein the at least one superconductor microstrip line and the at least two superconductor distributed tunnel junction elements include N/2 half-wavelength tunnel junction elements, N/2−1 half-wavelength microstrip lines, and one quarter-wavelength microstrip line; and
   the first tunnel junction element is connected to a signal output part, the Nth component from the first tunnel junction element is the quarter-wavelength microstrip line for impedance matching, and the quarter-wavelength microstrip line is connected to an input signal part.

6. The superconductor integrated circuit of claim 4, wherein the tuning circuit acts as a mixer circuit, so that, when a signal and a local signal of different frequency with the signal are input, signals of the frequency difference between the signal and a local oscillation signal are output.

* * * * *